(12) United States Patent
Cho et al.

(10) Patent No.: US 11,756,949 B2
(45) Date of Patent: Sep. 12, 2023

(54) INTEGRATED CIRCUIT INCLUDING ASYMMETRIC DECOUPLING CELL AND METHOD OF DESIGNING THE SAME

(71) Applicant: SAMSUNG ELECTRONICS CO., LTD., Suwon-si (KR)

(72) Inventors: Sungwe Cho, Hwaseongi-si (KR); Subin Jin, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 207 days.

(21) Appl. No.: 17/246,108

(22) Filed: Apr. 30, 2021

(65) Prior Publication Data
US 2022/0102336 A1 Mar. 31, 2022

(30) Foreign Application Priority Data
Sep. 29, 2020 (KR) .................. 10-2020-0127482

(51) Int. Cl.
| | |
|---|---|
| H01L 27/02 | (2006.01) |
| G06F 30/392 | (2020.01) |
| H01L 23/528 | (2006.01) |
| H01L 27/092 | (2006.01) |

(52) U.S. Cl.
CPC ........ *H01L 27/0207* (2013.01); *G06F 30/392* (2020.01); *H01L 23/5286* (2013.01); *H01L 27/0924* (2013.01)

(58) Field of Classification Search
CPC ............. H01L 27/0207; H01L 23/5286; H01L 27/0924; H01L 28/40; H01L 27/092; G06F 30/392; H03K 19/0016
See application file for complete search history.

(56) References Cited

U.S. PATENT DOCUMENTS

| | | | |
|---|---|---|---|
| 7,227,211 B2 | 6/2007 | Tsutsumi et al. | |
| 7,456,446 B2 | 11/2008 | Tahira et al. | |
| 8,125,248 B2 | 2/2012 | Noguchi | |
| 9,438,225 B1 | 9/2016 | Yeung et al. | |
| 10,032,763 B2 | 7/2018 | Kumar et al. | |
| 10,453,840 B2 | 10/2019 | Maeno | |
| 2005/0116268 A1* | 6/2005 | Tahira | ................. H01L 27/0207 257/E29.136 |
| 2019/0198530 A1* | 6/2019 | Hino | ..................... H01L 29/775 |
| 2020/0126972 A1 | 4/2020 | Chen et al. | |

FOREIGN PATENT DOCUMENTS

JP   2019-110205 A   7/2019

* cited by examiner

*Primary Examiner* — Karen Kusumakar
*Assistant Examiner* — Adam S Bowen
(74) *Attorney, Agent, or Firm* — Sughrue Mion, PLLC

(57) ABSTRACT

An integrated circuit includes at least one decoupling cell, wherein the at least one decoupling cell includes at least one P-type decoupling MOSFET and at least one N-type decoupling MOSFET, and a number of the at least one P-type decoupling MOSFET is different from a number of the at least one N-type decoupling MOSFET.

19 Claims, 15 Drawing Sheets

FIG. 4B
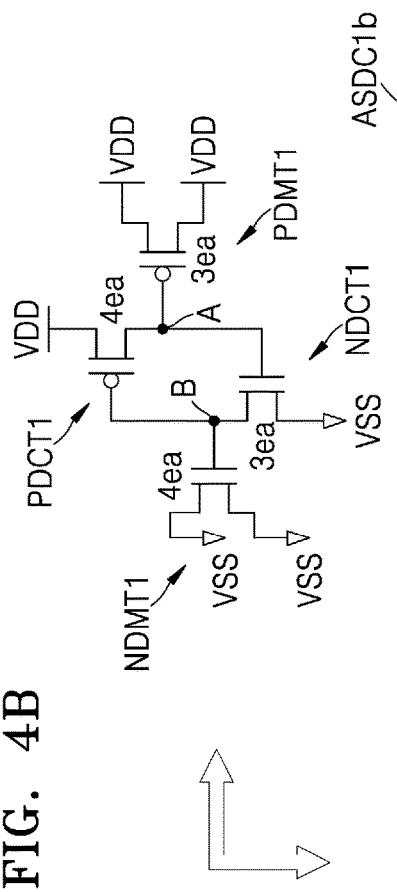
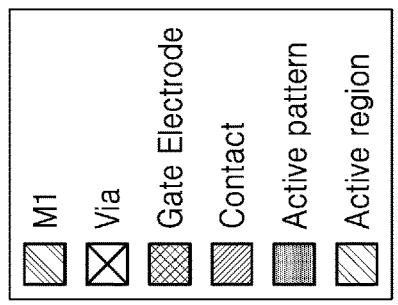
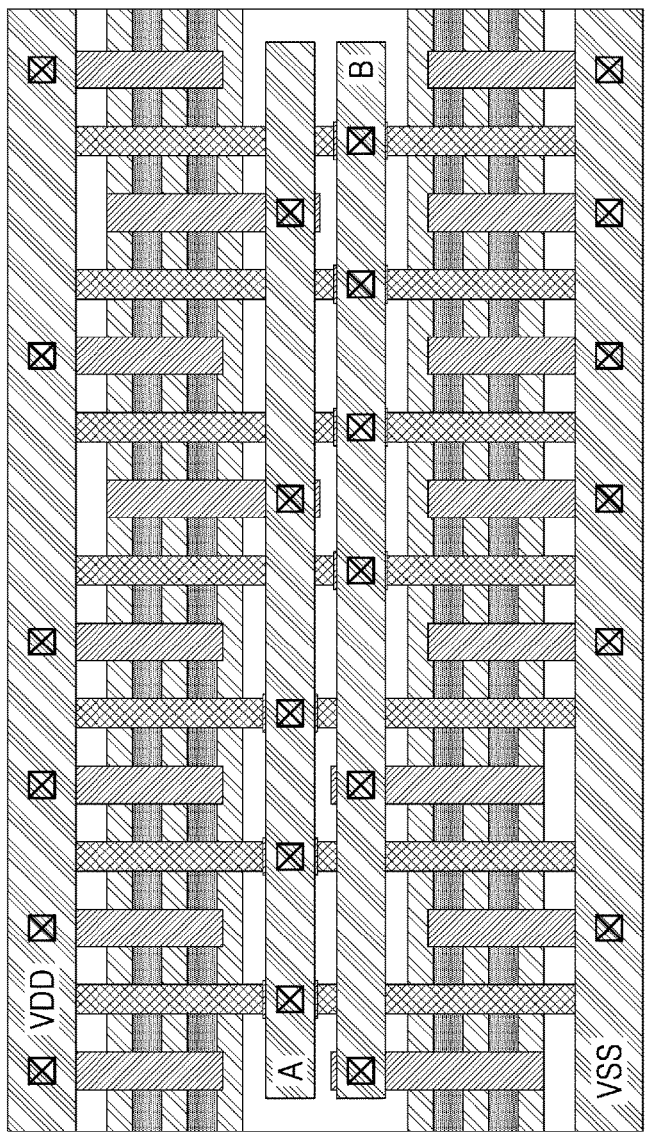
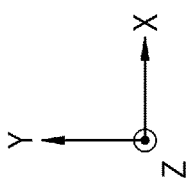

INTEGRATED CIRCUIT INCLUDING ASYMMETRIC DECOUPLING CELL AND METHOD OF DESIGNING THE SAME

CROSS-REFERENCE TO RELATED APPLICATION

This application is based on and claims priority under 35 U.S.C. § 119 to Korean Patent Application No. 10-2020-0127482, filed on Sep. 29, 2020, in the Korean Intellectual Property Office, the disclosure of which is incorporated by reference herein in its entirety.

BACKGROUND

The present disclosure relates to an integrated circuit, and more particularly, to an integrated circuit including a logic cell and a decoupling cell and a method of designing the integrated circuit.

For the operation of an integrated circuit, the integrated circuit may consume a current provided from a power supply. When a current consumption rapidly increases or decreases, a potential difference between a positive supply voltage and a negative supply voltage (e.g., a reference potential) may fluctuate. Noise caused by the fluctuation of the potential difference may lead to system failure. Therefore, a decoupling cell including a decoupling capacitor for stably maintaining a potential difference between a reference potential and a power supply potential despite the operation of the integrated circuit is employed in an integrated circuit.

SUMMARY

One or more example embodiments provide an integrated circuit including an asymmetric decoupling cell and a method of designing the same.

According to an aspect of an example embodiment, there is provided an integrated circuit including: at least one decoupling cell, wherein the at least one decoupling cell includes: a plurality of P-type metal-oxide-semiconductor field effect transistors (MOSFETs) arranged in a first direction; and a plurality of N-type MOSFETs spaced apart from the plurality of P-type MOSFETs in a second direction perpendicular to the first direction and arranged in the first direction, wherein the plurality of P-type MOSFETs comprise at least one P-type decoupling MOSFET, the plurality of N-type MOSFETs comprise at least one N-type decoupling MOSFET, and a first number of the at least one P-type decoupling MOSFET is different from a second number of the at least one N-type decoupling MOSFET.

According to an aspect of an example embodiment, there is provided an integrated circuit including: a first decoupling cell having a first height in a first direction, wherein the first decoupling cell includes: a plurality of first P-type metal-oxide-semiconductor field effect transistors arranged in a second direction perpendicular to the first direction; and a plurality of first N-type MOSFETs spaced apart from the plurality of first P-type MOSFETs in the first direction and arranged in the second direction, wherein the plurality of first P-type MOSFETs includes at least one first P-type decoupling MOSFET and at least one first P-type dummy MOSFET, the plurality of first N-type MOSFETs includes at least one first N-type decoupling MOSFET and at least one first N-type dummy MOSFET, and a first number of the at least one first P-type decoupling MOSFET is different from a second number of the at least one first N-type decoupling MOSFET.

According to an aspect of an example embodiment, there is provided an integrated circuit including: at least one decoupling cell, wherein the at least one decoupling cell includes: a first conductivity type decoupling metal-oxide-semiconductor field effect transistor; and a second conductivity type decoupling MOSFET, and a first capacitance associated with the first conductivity type decoupling MOSFET is greater than a second capacitance associated with the second conductivity type decoupling MOSFET.

BRIEF DESCRIPTION OF THE DRAWINGS

The above and/or other aspects will be more clearly understood from the following detailed description of example embodiments taken in conjunction with the accompanying drawings in which:

FIGS. 4A to 4D are diagrams for describing examples of asymmetric decoupling cells according to some other example embodiments;

DETAILED DESCRIPTION

Figure 1:
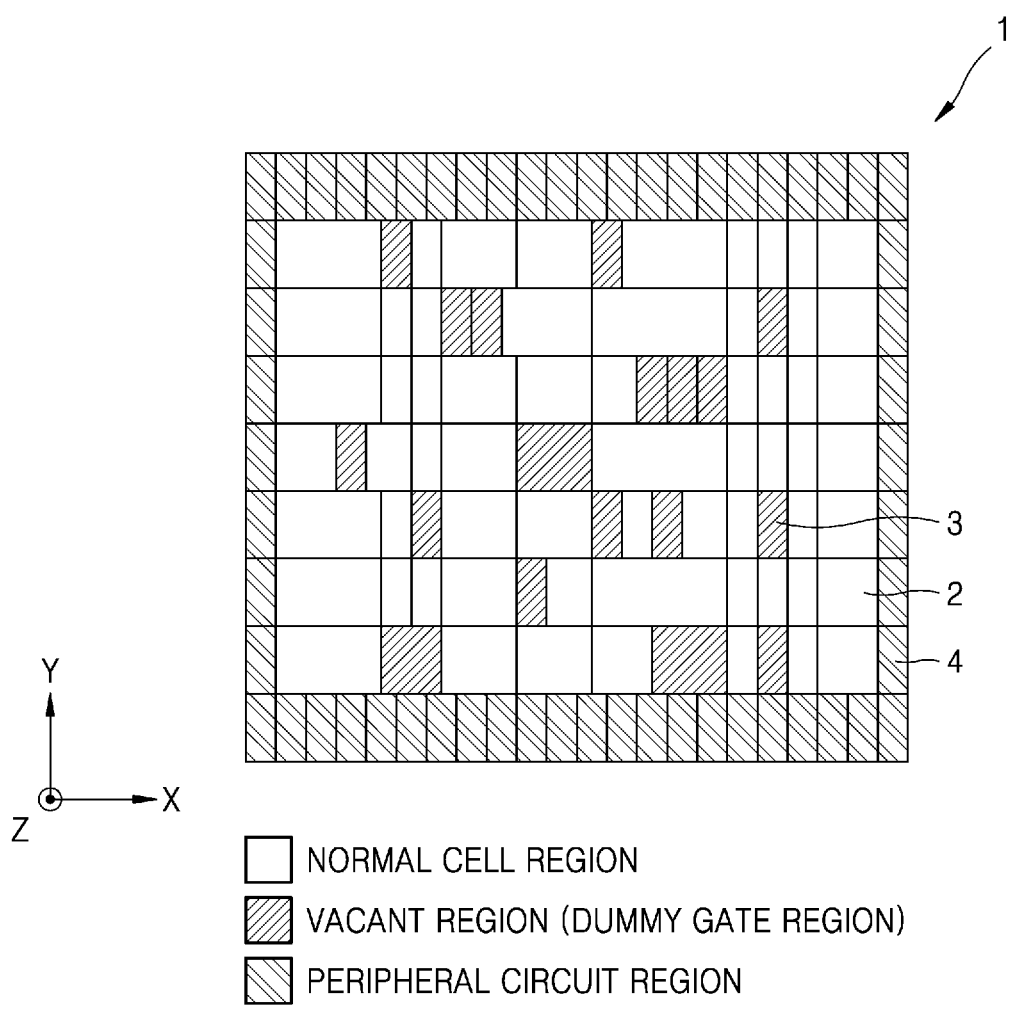
FIG. 1 is a layout diagram showing an integrated circuit according to example embodiments.

FIG. 1 is a layout diagram showing an integrated circuit according to example embodiments.

According to example embodiments, an integrated circuit 1 may include a logic block having a cell region 2 and an empty region 3. The integrated circuit 1 may further include a peripheral circuit region 4 surrounding edges of the logic block.

The integrated circuit 1 may include a plurality of cells arranged on the cell region 2. A cell is a unit of a layout included in an integrated circuit, may be designed to perform a predefined function, and may also be referred to as a standard cell. The integrated circuit 1 may include a plurality of cells having various functions, and the cells may be aligned and arranged according to a plurality of rows.

A complementary metal-oxide-semiconductor field effect transistor (MOSFET) (CMOSFET) including a P-type MOSFET and an N-type MOSFET may be formed on the cell region 2. A combination of the CMOSFETs may constitute a logic circuit for performing a predefined function.

A P-type MOSFET and an N-type MOSFET similar to those in the cell region 2 may be formed on the empty region 3. An asymmetric decoupling cell including a P-type MOSFET and an N-type MOSFET operating as decoupling capacitors may be provided in at least a portion of the empty region 3. Hereinafter, the asymmetric decoupling cell will be described in more detail.

Figure 2:
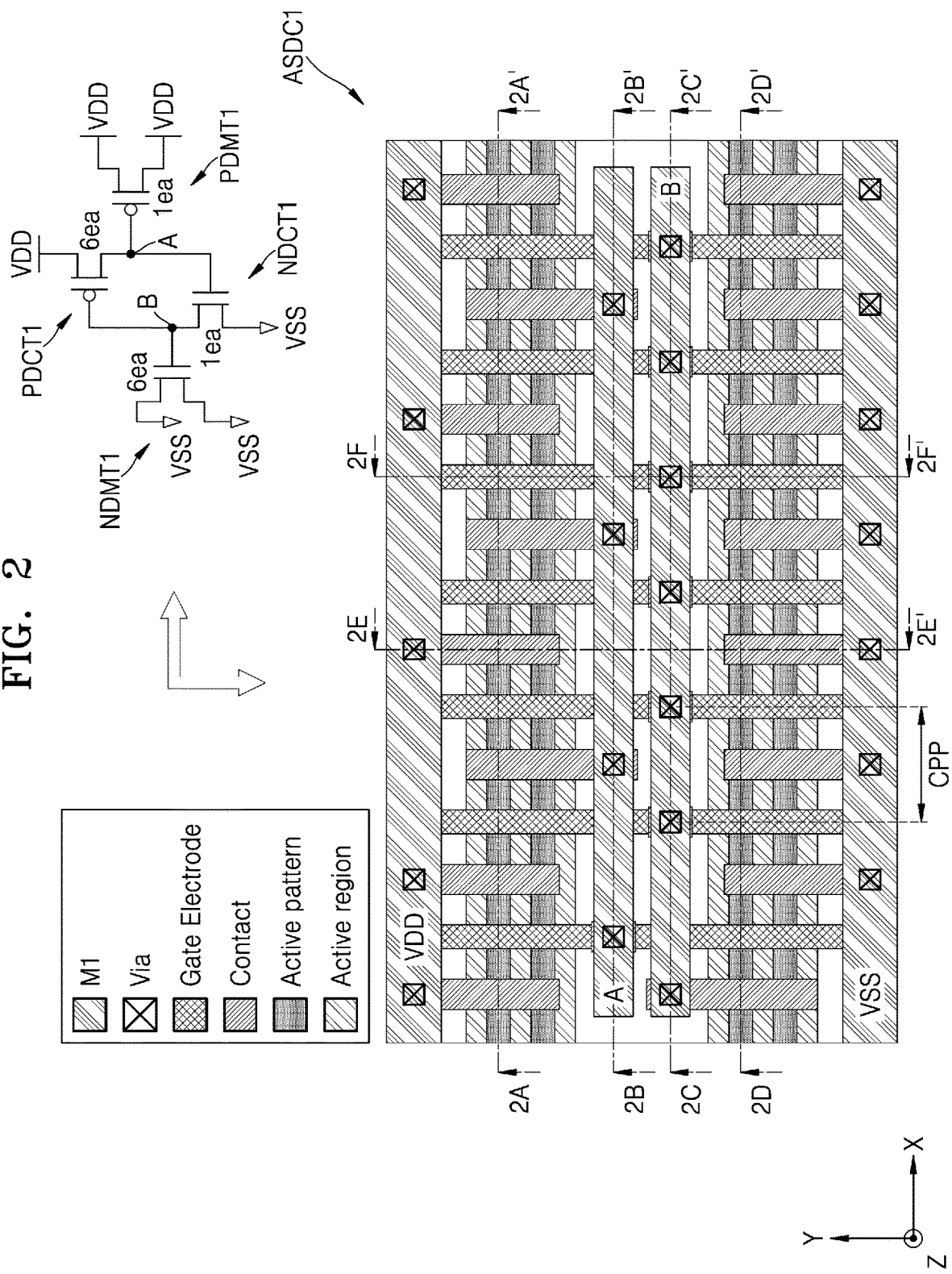
FIG. 2 is a layout diagram showing an example of an asymmetric decoupling cell according to an example embodiment.

FIG. 2 is a layout diagram showing an example of an asymmetric decoupling cell ASDC1 according to an example embodiment. In detail, the upper portion of FIG. 2 shows a circuit diagram of the asymmetric decoupling cell ASDC1, and the lower portion of FIG. 2 shows layouts of the asymmetric decoupling cell ASDC1.

A plane including an X-axis and a Y-axis may be referred to as a horizontal plane, components disposed in the positive (+) Z direction relative to other components may be referred to as being above the other components, and components disposed in the negative (−) Z direction relative to other components may be referred to as being below the other components. Also, an area of a component may refer to a size occupied by the component in a plane parallel to the horizontal plane, and a height of a component may refer to a length of the component in the Y-axis direction. In the drawings of the present specification, only some layers may be shown for convenience of illustration, and vias may be shown even though they are under a pattern of a wiring layer to indicate connections between the pattern of the wiring layer and patterns therebelow.

Patterns to which a positive supply voltage VDD and a negative supply voltage (or ground potential) VSS are respectively applied at the boundary of a row (which may be referred to as power lines herein) may extend in the X-axis direction, and a first active region RX1 (refer to FIG. 3E) in which a P-type MOSFET is formed and a second active region RX2 (refer to FIG. 3E) in which an N-type MOSFET is formed may extend in the X-axis direction. In some embodiments, the patterns providing supply voltages are included in one or more wiring layers.

As shown in FIG. 2, at least one active pattern may extend in the X-axis direction on the active region. An active pattern may intersect with a gate electrode extending in the Y-axis direction and constitute a transistor. When a fin-type active pattern extends in the X-axis direction, a transistor formed by the fin-type active pattern and a gate electrode may be referred to as a FinFET. As described below with reference to FIGS. 3A to 3E, example embodiments will be described by mainly focusing on cells including FinFETs, but it would be understood that the descriptions may also be applied to cells including transistors having structures different from FinFETs. For example, an active pattern may include a plurality of nanosheets that are spaced from one another in the Z-axis direction and extend in the X-axis direction, and a cell may include a multi-bridge channel FET (MBCFET) in which the nanosheets constitute a gate electrode. Also, a cell may include a ForkFET in which nanosheets for a P-type transistor and nanosheets for an N-type transistor are separated from each other by a dielectric wall, and thus, an N-type transistor and a P-type transistor have adjacent structures. Also, a cell may include a vertical FET (VFET) having a structure in which source/drain regions are spaced apart from each other in the Z-axis direction with a channel region therebetween, and a gate electrode surrounds the channel region. Also, a cell may include a field effect transistor (FET) like a complementary FET (CFET), a negative FET (NCFET), and a carbon nanotube (CNT) FET and may also include a bipolar junction transistor and other three-dimensional (3D) transistors.

The asymmetric decoupling cell ASDC1 may be a cell for maintaining a constant voltage difference between the positive supply voltage VDD and the negative supply voltage (or ground potential) VSS. According to example embodiments, the asymmetric decoupling cell ASDC1 may not include an input pin and an output pin that are already formed in a wiring layer M1.

In the present embodiment, the asymmetric decoupling cell ASDC1 may include 7 N-type MOSFETs and 7 P-type MOSFETs. According to example embodiments, N-type MOSFETs may include one or more N-type decoupling MOSFETs NDCT1 and one or more N-type dummy MOSFETs NDMT1. According to example embodiments, P-type MOSFETs may include one or more P-type decoupling MOSFETs PDCT1 and one or more P-type dummy MOSFETs PDMT1.

The asymmetric decoupling cell ASDC1 may have an asymmetric circuit configuration. According to example embodiments, the number of P-type decoupling MOSFETs PDCT1 may be different from the number of N-type decoupling MOSFETs NDCT1. The asymmetric decoupling cell ASDC1 may use P-type MOSFETs as main decoupling capacitors. Here, the asymmetric decoupling cell ASDC1 using P-type MOSFETs as main decoupling capacitors indicates that the number of P-type MOSFETs used as decoupling capacitors is greater than the number of N-type MOSFETs used as decoupling capacitors. According to some embodiments, the number of P-type decoupling MOSFETs PDCT1 may be greater than the number of N-type decoupling MOSFETs NDCT1. For example, as shown in FIG. 2, the number of P-type decoupling MOSFETs PDCT1 may be 6, whereas the number of N-type decoupling MOSFETs NDCT1 may be 1.

According to example embodiments, the number of P-type dummy MOSFETs PDMT1 may be different from the number of N-type dummy MOSFETs NDMT1. According to example embodiments, the number of P-type dummy MOSFETs PDMT1 may be less than the number of N-type dummy MOSFETs NDMT1. For example, as shown in FIG. 2, the number of P-type dummy MOSFETs PDMT1 may be 1, whereas the number of N-type dummy MOSFETs NDMT1 may be 6.

The asymmetric decoupling cell ASDC1 may include 4 active patterns extending in the X direction. According to example embodiments, the asymmetric decoupling cell ASDC1 may have a width (length in the X direction) corresponding to 8 gate pitches CPP.

As process technology is developed, when the height of a cell (i.e., the length in the Y direction) decreases, due to the reduction of a space between a first active region and a second active region, there may be insufficient space in a decoupling cell to separate and re-route a gate on the first active region and a gate on the second active region. Therefore, only one of a P-type MOSFET and an N-type MOSFET located at the same position in the X direction (or overlapping each other in the Y direction) may be used as a decoupling capacitor.

Here, the capacitance of a P-type decoupling MOSFET may be similar to the capacitance of an N-type decoupling MOSFET. On the other hand, leakage currents due to gate tunneling of a P-type decoupling MOSFET and an N-type decoupling MOSFET may vary according to the characteristics of an integrated circuit, e.g., a gate pitch CPP. For example, when the gate pitch CPP of an integrated circuit is within a first range (e.g., from about 1 nm to about 10 nm), a leakage current due to one P-type MOSFET may be less than a leakage current due to one N-type MOSFET. In another example, when the minimum pitch of the integrated circuit is within a second range different from the first range, a leakage current due to one N-type MOSFET may be less than a leakage current due to one P-type MOSFET.

According to example embodiments, a decoupling cell may be configured by mainly using those with superior leakage current characteristics from between P-type MOSFETs and N-type MOSFETs. In detail, by using conductive-type MOSFETs having a small leakage current characteristic according to the characteristics of the integrated circuit (e.g., the minimum pitch) as the main decoupling capacitors, a decoupling cell having the same level of capacitance and improved leakage current characteristics may be provided.

Figure 3A:
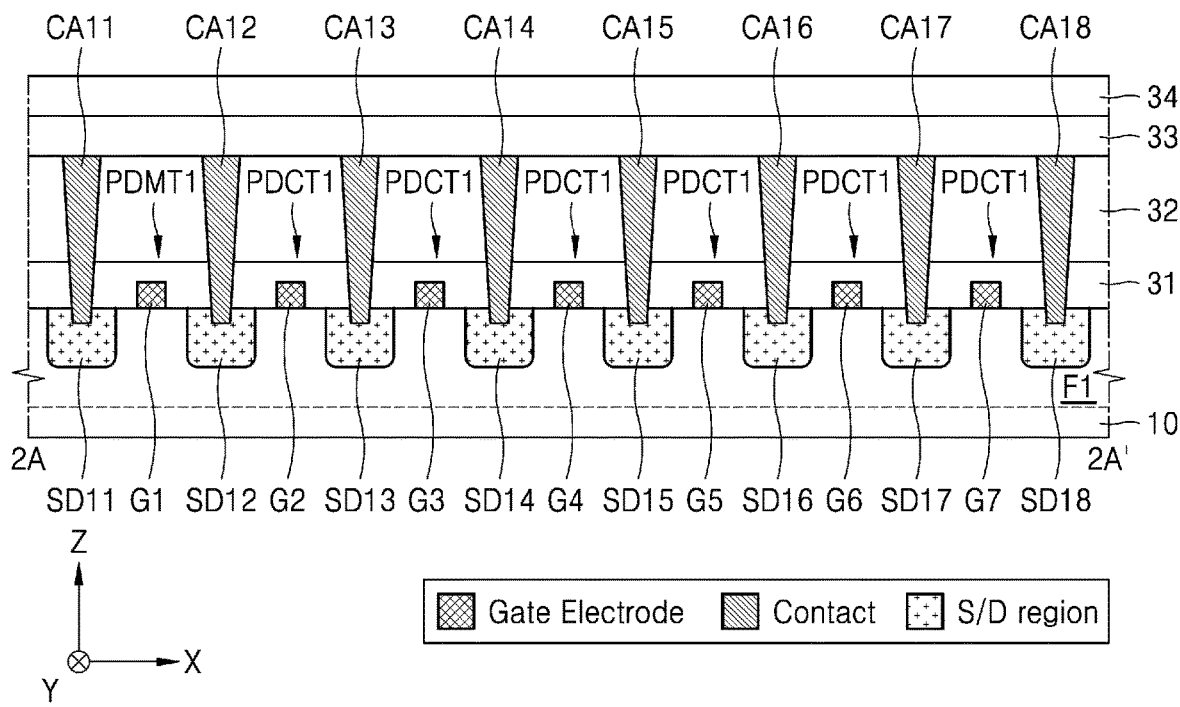
FIGS. 3A to 3F are cross-sectional views of examples of a structure of a cell according to an example embodiment.
Figure 3B:
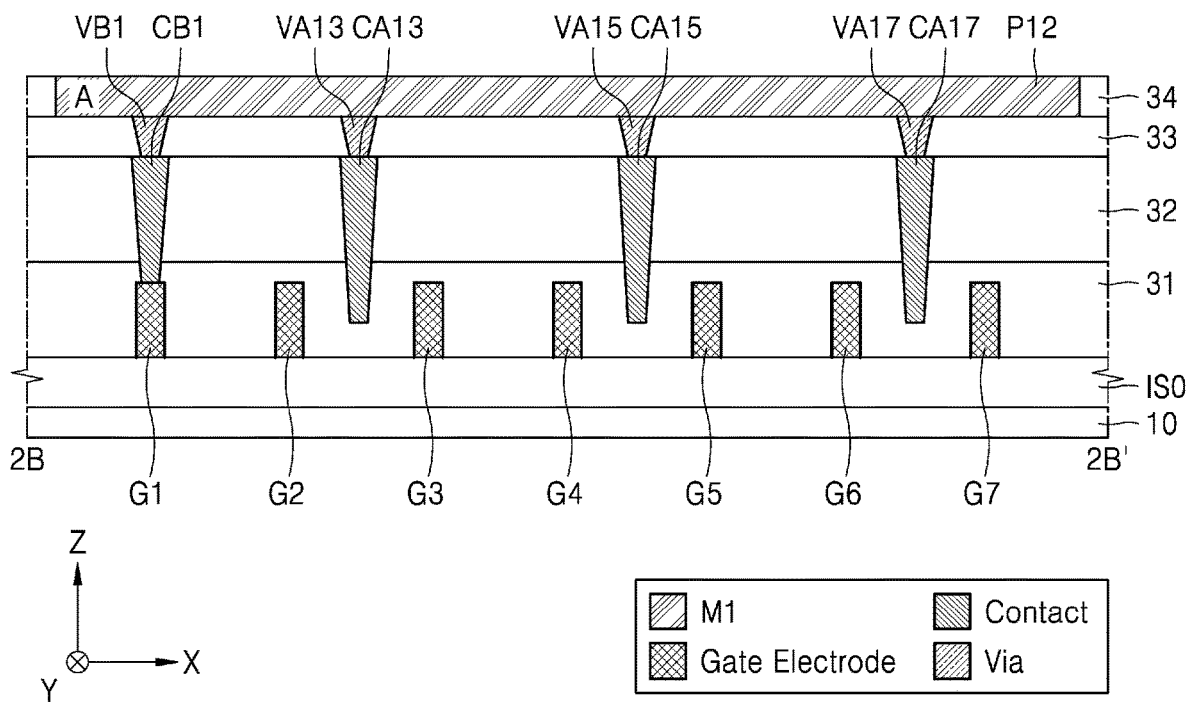
Figure 3C:
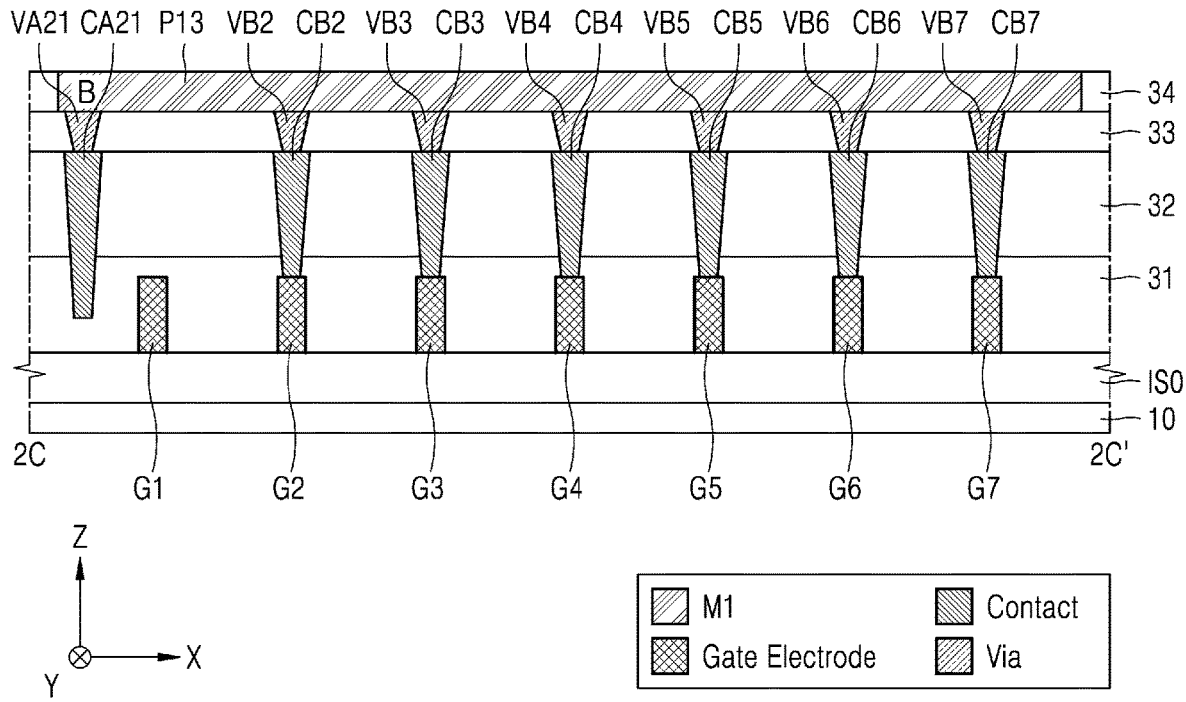
Figure 3D:
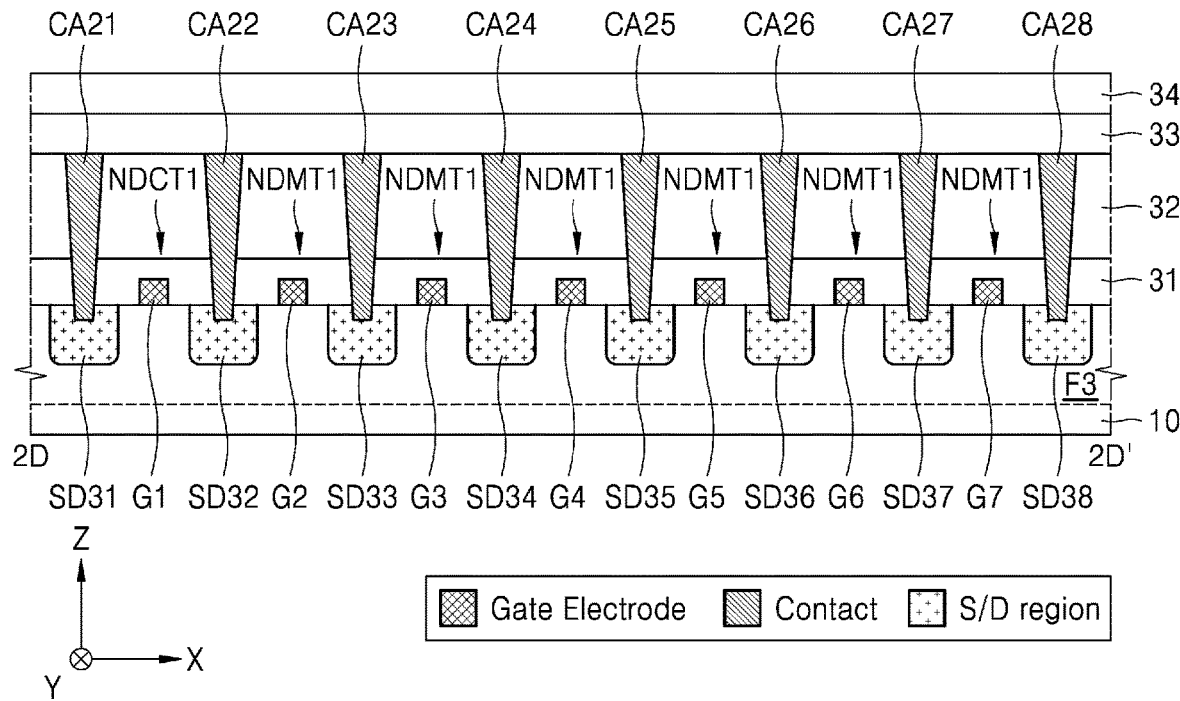
Figure 3E:
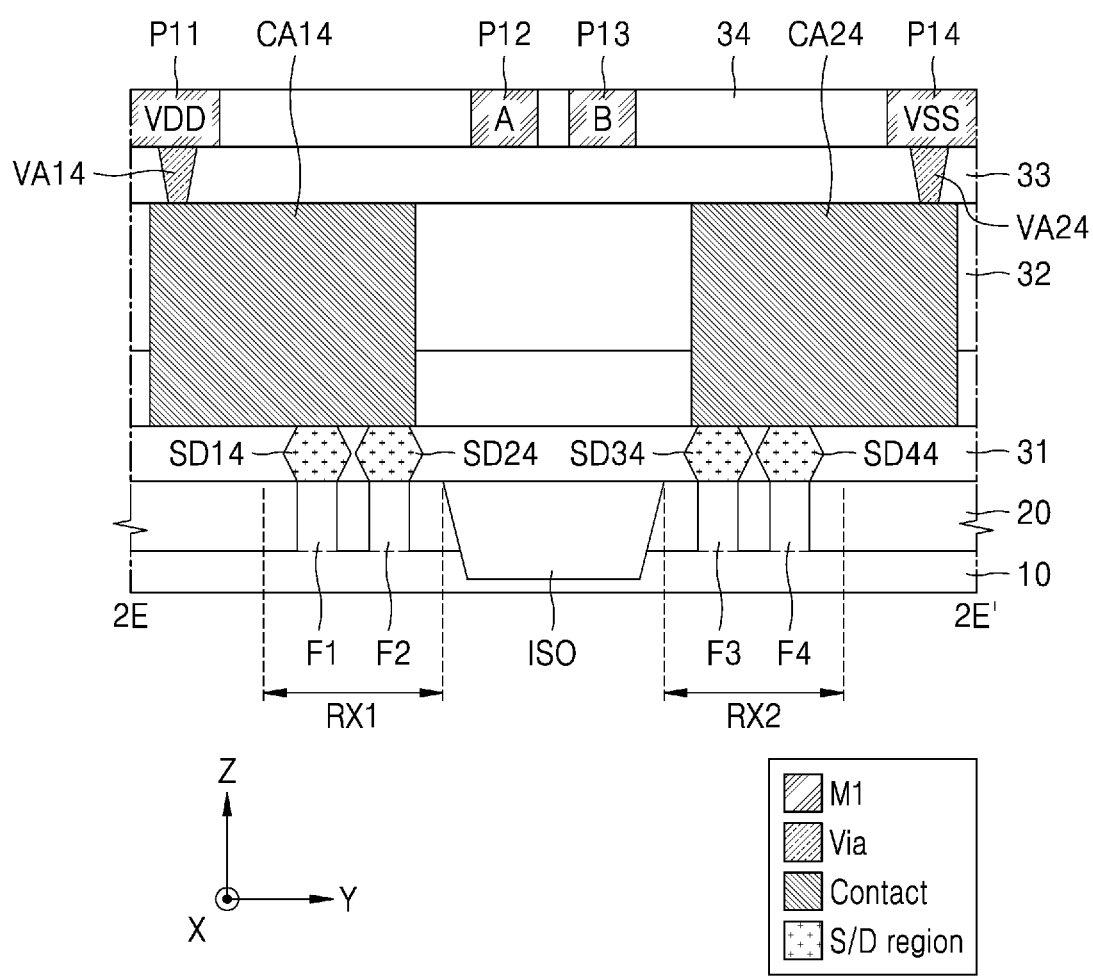
Figure 3F:
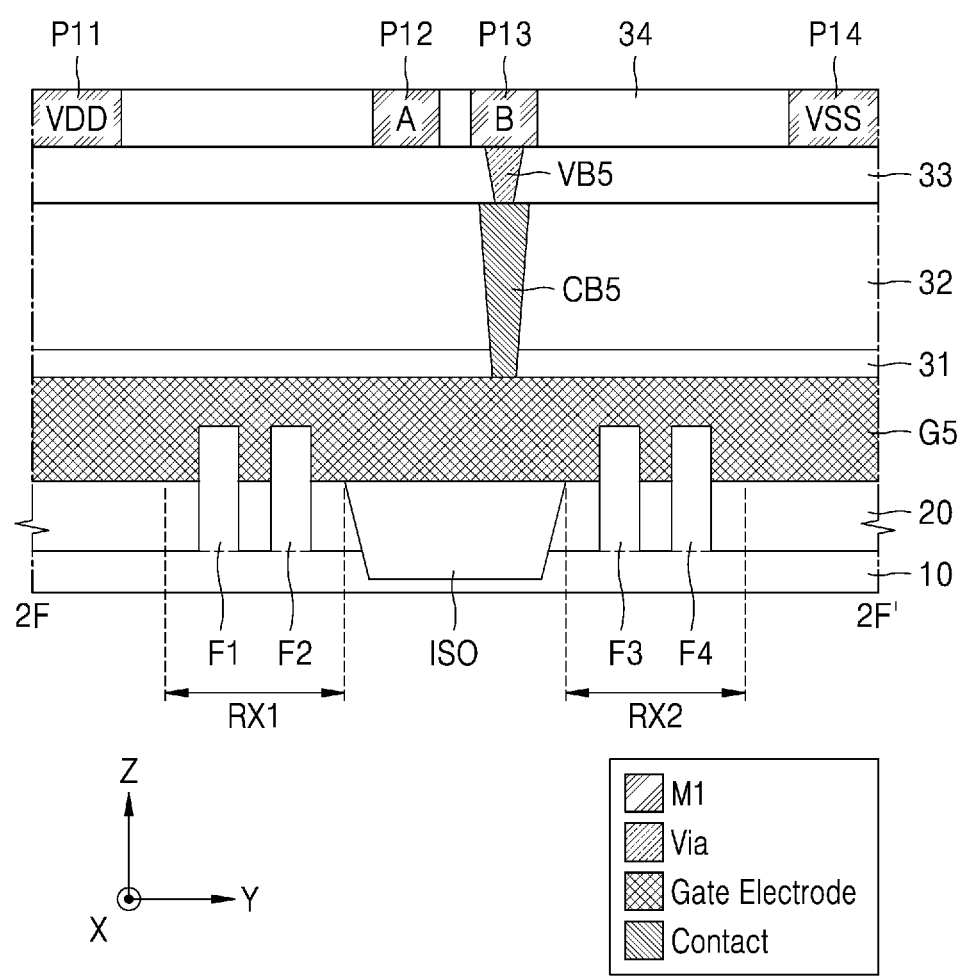

FIGS. 3A to 3F are cross-sectional views of examples of a structure of a cell according to an example embodiment. In detail, FIG. 3A is a cross-sectional view taken along a line 2A-2A' of FIG. 2, FIG. 3B is a cross-sectional view taken along a line 2B-2B' of FIG. 2, FIG. 3C is a cross-sectional view taken along a line 2C-2C' of FIG. 2, FIG. 3D is a cross-sectional view taken along a line 2D-2D' of FIG. 2, FIG. 3E is a cross-sectional view taken along a line 2E-2E' of FIG. 2, and FIG. 3F is a cross-sectional view taken along a line 2F-2F' of FIG. 2.

Although not shown in FIGS. 3A to 3F, gate spacers may be formed on side surfaces of a gate electrode, and gate dielectric layers may be formed between the gate electrode and the gate spacer, and on the bottom surface of the gate electrode. Also, a barrier layer may be formed on a surface of a contact and/or a via. Hereinafter, FIGS. 3A to 3E will be described with reference to FIG. 2, and descriptions already given with reference to FIGS. 3A to 3E will be omitted.

Referring to FIG. 3A, a substrate 10 may include bulk silicon or a silicon-on-insulator (SOI). As a non-limiting example, the substrate 10 may include SiGe, silicon germanium on insulator (SGOI), InSb, a PbTe compound, InAs, a phosphide, GaAs, or GaSb. The first fin F1 may extend in the X-axis direction on the substrate 10. First to eighth source/drain regions SD11, SD12, SD13, SD14, SD15, SD16, SD17, and SD18 may be formed in the first fin F1. First to fourth interlayer insulation layers 31, 32, 33, and 34 may be formed on the first fin F1.

First and second source/drain regions SD11 and SD12 and a first gate electrode G1 may constitute a P-type dummy MOSFET PMNT1. Second and third source/drain regions SD12 and SD13 and a second gate electrode G2 may constitute a P-type decoupling MOSFET PDCT1. Third and fourth source/drain regions SD13 and SD14 and a third gate electrode G3 may constitute a P-type decoupling MOSFET PDCT1. Fourth and fifth source/drain regions SD14 and SD15 and a fourth gate electrode G4 may constitute a P-type decoupling MOSFET PDCT1. Fifth and sixth source/drain regions SD15 and SD16 and a fifth gate electrode G5 may constitute a P-type decoupling MOSFET PDCT1. Sixth and seventh source/drain regions SD16 and SD17 and a sixth gate electrode G6 may constitute a P-type decoupling MOSFET PDCT1. Seventh and eighth source/drain regions SD17 and SD18 and a seventh gate electrode G7 may constitute a P-type decoupling MOSFET PDCT1. Therefore, the asymmetric decoupling cell ASDC1 may include 6 P-type decoupling MOSFETs PDCT1 and 1 dummy P-type MOSFET PDMT1.

First to eighth source/drain contacts CA11, CA12, CA13, CA14, CA15, CA16, CA17, and CA18 may penetrate through the second interlayer insulation layer 32 and may be sequentially connected to the first to eighth source/drain regions SD11, SD12, SD13, SD14, SD15, SD16, SD17, and SD18, respectively. At least one of the first to eighth source/drain contacts CA11, CA12, CA13, CA14, CA15, CA16, CA17, and CA18 may include a lower source/drain contact penetrating through the first interlayer insulation layer 31 and an upper source/drain contact penetrating through the second interlayer insulation layer 32.

The first to eighth source/drain contacts CA11, CA12, CA13, CA14, CA15, CA16, CA17, and CA18 may be connected to any one of patterns of a first wiring layer M1 through vias penetrating through the third interlayer insulation layer 33. According to some embodiments, first, second, fourth, sixth, and eighth source/drain contacts CA11, CA12, CA14, CA16, and CA18 may be connected to a first pattern P11 to which the positive supply voltage VDD is applied. Therefore, the positive supply voltage VDD may be applied to first, second, fourth, sixth, and eighth source/drain patterns SD11, SD12, SD14, SD16, and SD18. A layer in which the first pattern P11 and the fourth interlayer insulation layer 34 are formed may be referred to as the first wiring layer M1. In the first wiring layer M1, second to fourth patterns P22, P23, and P24 (refer to FIG. 3E) described later may be further formed.

Referring to FIG. 3B, a device isolation layer ISO may be formed on the substrate 10. The device isolation layer ISO may separate active regions, as described below with reference to FIGS. 3E and 3F. The first to fourth interlayer insulation layers 31 to 34 may be formed on the device isolation layer ISO. A first gate contact CB1 may penetrate through the second interlayer insulation layer 32 and be connected to the first gate electrode G1. A first gate via VB1 may penetrate through the third interlayer insulation layer 33 and be connected to the first gate contact CB1 and the second pattern P12. The second pattern P12 corresponds to a node A in the circuit diagram of FIG. 2.

Third, fifth, and seventh source/drain contacts CA13, CA15, and CA17 may penetrate through the second interlayer insulation layer 32. Third, fifth, and seventh source/drain vias VA13, VA15, and VA17 may penetrate through the third interlayer insulation layer 33 and be connected to the second pattern P12. The third, fifth, and seventh source/drain vias VA13, VA15, and VA17 may be sequentially connected to the third, fifth, and seventh source/drain contacts CA13, CA15, and CA17, respectively. Therefore, third, fifth, and seventh source/drain regions S13, S15, and S17 shown in FIG. 3A may be electrically shorted to the first gate electrode G1 at the node A.

In some embodiments, differently as shown in FIG. 3B, the first gate contact CB1 may be omitted, and the second pattern P12 may be electrically connected to the second gate electrode G2 through a gate via penetrating through second and third interlayer insulation layers 32 and 33.

Referring to FIG. 3C, second to seventh gate contacts CB2, CB3, CB4, CB5, CB6, and CB7 may penetrate through the second interlayer insulation layer 32 and be sequentially connected to second to seventh gate electrodes G2, G3, G4, G5, G6, and G7, respectively. Second to seventh gate vias VB2, VB3, VB4, VB5, VB6, and VB7 may penetrate through the third interlayer insulation layer 33 and be connected to the second to seventh gate electrodes G2, G3, G4, G5, G6, and G7, respectively. The second to seventh gate vias VB2, VB3, VB4, VB5, VB6, and VB7 may be further connected to a third pattern P13. The third pattern P13 corresponds to a node B in the circuit diagram of FIG. 2.

A first source/drain contact CA21 may penetrate through the second interlayer insulation layer 32. A first source/drain via VA21 may penetrate through the third interlayer insulation layer 33 and be connected to the third pattern P13 and the first source/drain contact CA21. Therefore, a first source/drain region SD31 (refer to FIG. 3D) formed on an NMOS region may be electrically shorted from the second to seventh gate electrodes G2, G3, G4, G5, G6, and G7 at the node B.

In some embodiments, differently as shown in FIG. 3C, the second to seventh gate contacts CB2, CB3, CB4, CB5, CB6, and CB7 may be omitted, and the third pattern P13 may be connected to the second gate electrode G2 via a gate via penetrating through the second and third insulation layers 32 and 33.

Referring to FIG. 3D, first to eighth source/drain regions SD31, SD32, SD33, SD34, SD35, SD36, SD37, and SD38 may be formed in a third fin F3. The first to fourth interlayer insulation layers 31, 32, 33, and 34 may be formed on the third fin F3.

First and second source/drain regions SD31 and SD32 and the first gate electrode G1 may constitute an N-type decoupling MOSFET NDCT1. Second and third source/drain regions SD32 and SD33 and the second gate electrode G2 may constitute an N-type dummy MOSFET NDMT1. Third and fourth source/drain regions SD33 and SD34 and the third gate electrode G3 may constitute an N-type dummy MOSFET NDMT1. Fourth and fifth source/drain regions SD34 and SD35 and the fourth gate electrode G4 may constitute an N-type dummy MOSFET NDMT1. Fifth and sixth source/drain regions SD35, SD36 and the fifth gate electrode G5 may constitute an N-type dummy MOSFET NDMT1. Sixth and seventh source/drain regions SD36 and SD37 and the sixth gate electrode G6 may constitute an N-type dummy MOSFET NDMT1. Seventh and eighth source/drain regions SD37 and SD38 and the seventh gate electrode G7 may constitute an N-type dummy MOSFET NDMT1. Therefore, the asymmetric decoupling cell ASDC1 may include 1 N-type decoupling MOSFET NDCT1 and 6 N-type dummy MOSFETs NDMT1.

First to eighth source/drain contacts CA21, CA22, CA23, CA24, CA25, CA26, CA27, and CA28 may penetrate through the second interlayer insulation layer 32 and may be sequentially connected to the first to eighth source/drain regions SD31, SD32, SD33, SD34, SD35, SD36, SD37, and SD38, respectively. At least one of the first to eighth source/drain contacts CA21, CA22, CA23, CA24, CA25, CA26, CA27, and CA28 may include a lower source/drain contact penetrating through the first interlayer insulation layer 31 and an upper source/drain contact penetrating through the second interlayer insulation layer 32.

The first to eighth source/drain contacts CA21, CA22, CA23, CA24, CA25, CA26, CA27, and CA28 may be connected to any one of patterns of the first wiring layer M1 through vias penetrating through a third inter-wire insulation layer 33. According to some embodiments, first, second, fourth, sixth, and eighth source/drain contacts CA21, CA22, CA24, CA26, and CA28 may be connected to a fourth pattern P14 to which the negative supply voltage (or ground potential) VSS is applied. Therefore, the negative supply voltage (or ground potential) VSS may be applied to first, second, fourth, sixth, and eighth source/drain patterns SD31, SD32, SD34, SD36, and SD38.

Referring to FIG. 3E, a field insulation layer 20 may be formed on the substrate 10. As non-limiting examples, the field insulation layer 20 may include any one of $SiO_2$, SiN, SiON, SiOCN, and combinations thereof. In some embodiments, the field insulation layer 20 may surround some of side surfaces of an active pattern, that is, a fin, as shown in FIG. 3D. The first to fourth interlayer insulation layers 31, 32, 33, and 34 may be formed on the field insulation layer 20. First to fourth fins F1, F2, F3, and F4 may extend in the X-axis direction on the field insulation layer 20.

Source-drain regions SD14, SD24, SD34, and SD44 may be arranged on the first to fourth fins F1, F2, F3, and F4, respectively. The isolation layer ISO extending in the X direction may be provided between first and second fins F1 and F2 and third and fourth fins F3 and F4. First and second active regions RX1 and RX2 may be separated from each other by the device isolation layer ISO.

A fourth source/drain contact CA14 may penetrate through the second interlayer insulation layer 32 and be connected to two source/drain regions SD14 and SD24, and thus, the two source/drain regions SD14 and SD24 may be electrically connected to each other. Also, a fourth source/drain contact CA24 may penetrate through the second interlayer insulation layer 32 and be connected to two source/drain regions SD34 and SD44, and thus, the two source/drain regions SD34 and SD34 may be electrically connected to each other.

A fourth source/drain via VA14 may penetrate through the third interlayer insulation layer 33 and be connected to the fourth source/drain contact CA14 and the first pattern P11. Therefore, the positive supply voltage VDD may be applied to the source/drain regions SD14 and SD24. A fourth source/drain via VA24 may penetrate through the third interlayer insulation layer 33 and be connected to the fourth source/drain contact CA24 and the fourth pattern P14. Therefore, the negative supply voltage (or ground potential) VSS may be applied to the source/drain regions SD14 and SD24. The first to fourth patterns P11, P12, P13, and P14 described above may be formed in the first wiring layer M1.

Referring to FIG. 3E, the field insulation layer 20 may be formed on the substrate 10, and the first to fourth fins F1, F2, F3, and F4 penetrating through the field insulation layer 20 may intersect with the fifth gate electrode G5 extending in the Y-axis direction. For example, the fifth gate electrode G5 may include a metal like Ti, Ta, W, Al, or Co or a combination thereof. In another example, the fifth gate electrode G5 may include a semiconductor material like Si or SiGe. In another example, the fifth gate electrode G5 may include a multilayer structure in which two or more conductive materials are stacked. For example, according to some embodiments, the fifth gate electrode G5 may include a conformal deposition structure of a work function layer including any one of TiN, TaN, TiC, TaC, and TiAlC and a filling conductive film that fills the interior of the conformal deposition structure of the work function layer and includes W or Al.

As described above, the fifth gate electrode G5 may be electrically connected to the third pattern P13 through a fifth gate contact CB5 and a gate via VB5.

FIGS. 4A to 4D are diagrams for describing examples of asymmetric decoupling cells according to some other embodiments.

Figure 4A:
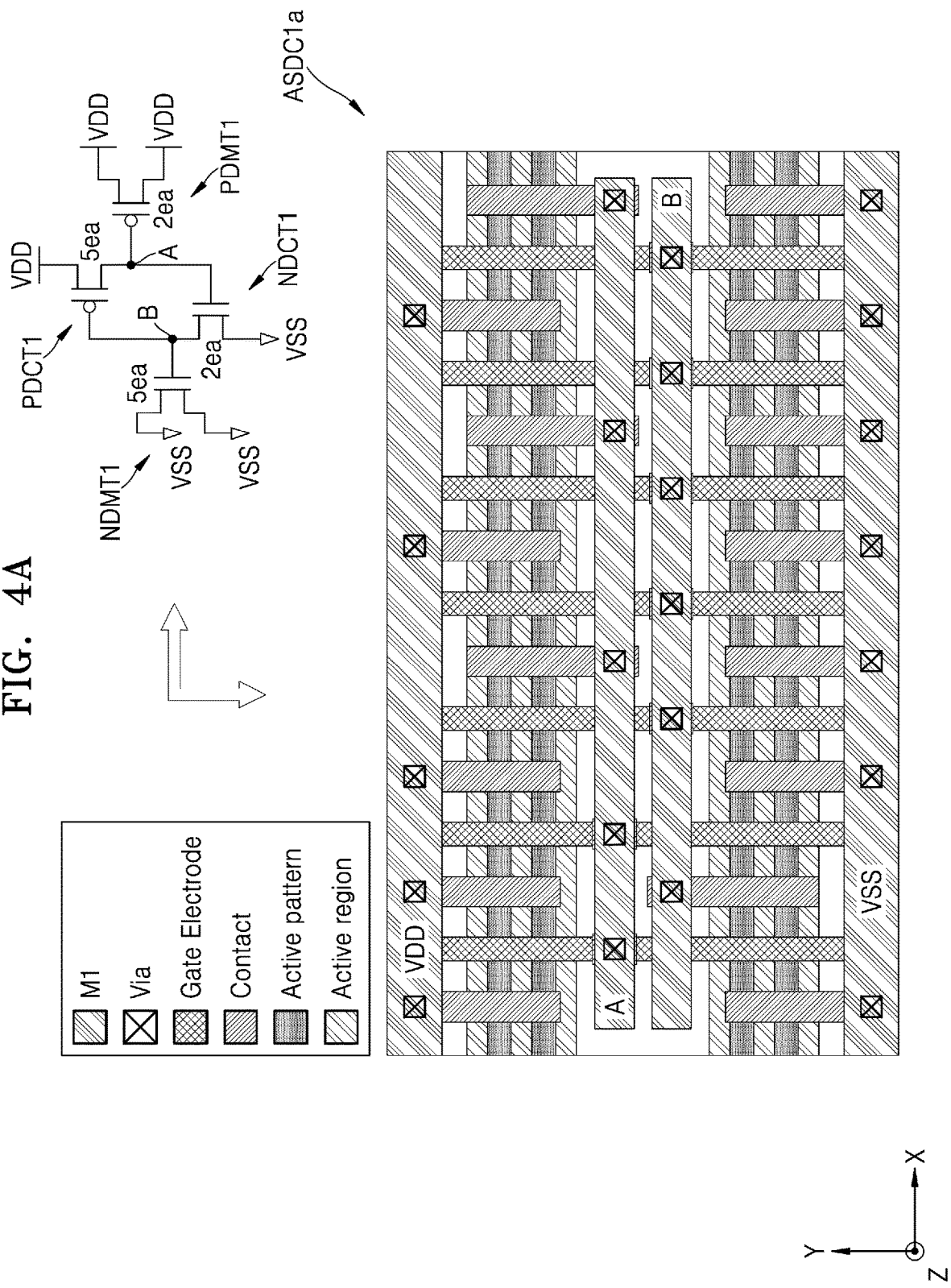

FIG. 4A is a diagram for describing an example of an asymmetric decoupling cell ASDC1a according to some other embodiments. In detail, the upper portion of FIG. 4A shows a circuit diagram corresponding to the asymmetric decoupling cell ASDC1a, and the lower portion of FIG. 4A shows a layout corresponding to the asymmetric decoupling cell ASDC1a.

For convenience of explanation, descriptions identical to those already given above with reference to FIGS. 2 to 3E will be omitted, and descriptions below will focus on differences therefrom.

Referring to FIG. 4A, the asymmetric decoupling cell ASDC1a may include 7 N-type MOSFETs and 7 P-type MOSFETs. Unlike the asymmetric decoupling cell ASDC1 of FIG. 2, the asymmetric decoupling cell ASDC1a may include 5 P-type decoupling MOSFETs PDCT1, 2 P-type dummy MOSFETs PDMT1, 2 N-type decoupling MOSFETs NDCT1, and 5 N-type dummy MOSFETs NDMT1. According to example embodiments, the asymmetric decoupling cell ASDC1a is configured mainly with P-type MOSFETs having excellent current leakage characteristics. However, because the number of P-type decoupling MOSFETs PDCT1 and the number of N-type decoupling MOSFETs NDCT1 may be freely changed, the freedom of design may be improved.

FIG. 4B is a diagram for describing an example of an asymmetric decoupling cell ASDC1b according to some other embodiments. In detail, the upper portion of FIG. 4B shows a circuit diagram corresponding to the asymmetric decoupling cell ASDC1b, and the lower portion of FIG. 4B shows a layout corresponding to the asymmetric decoupling cell ASDC1b.

For convenience of explanation, descriptions identical to those already given above with reference to FIGS. 2 to 3E will be omitted, and descriptions below will focus on differences therefrom.

Referring to FIG. 4B, the asymmetric decoupling cell ASDC1b may include 7 N-type MOSFETs and 7 P-type MOSFETs. Unlike the asymmetric decoupling cell ASDC1 of FIG. 2, the asymmetric decoupling cell ASDC1b may include 4 P-type decoupling MOSFETs PDCT1, 3 P-type dummy MOSFETs PDMT1, 3 N-type decoupling MOSFETs NDCT1, and 4 N-type dummy MOSFETs NDMT1.

Figure 4C:
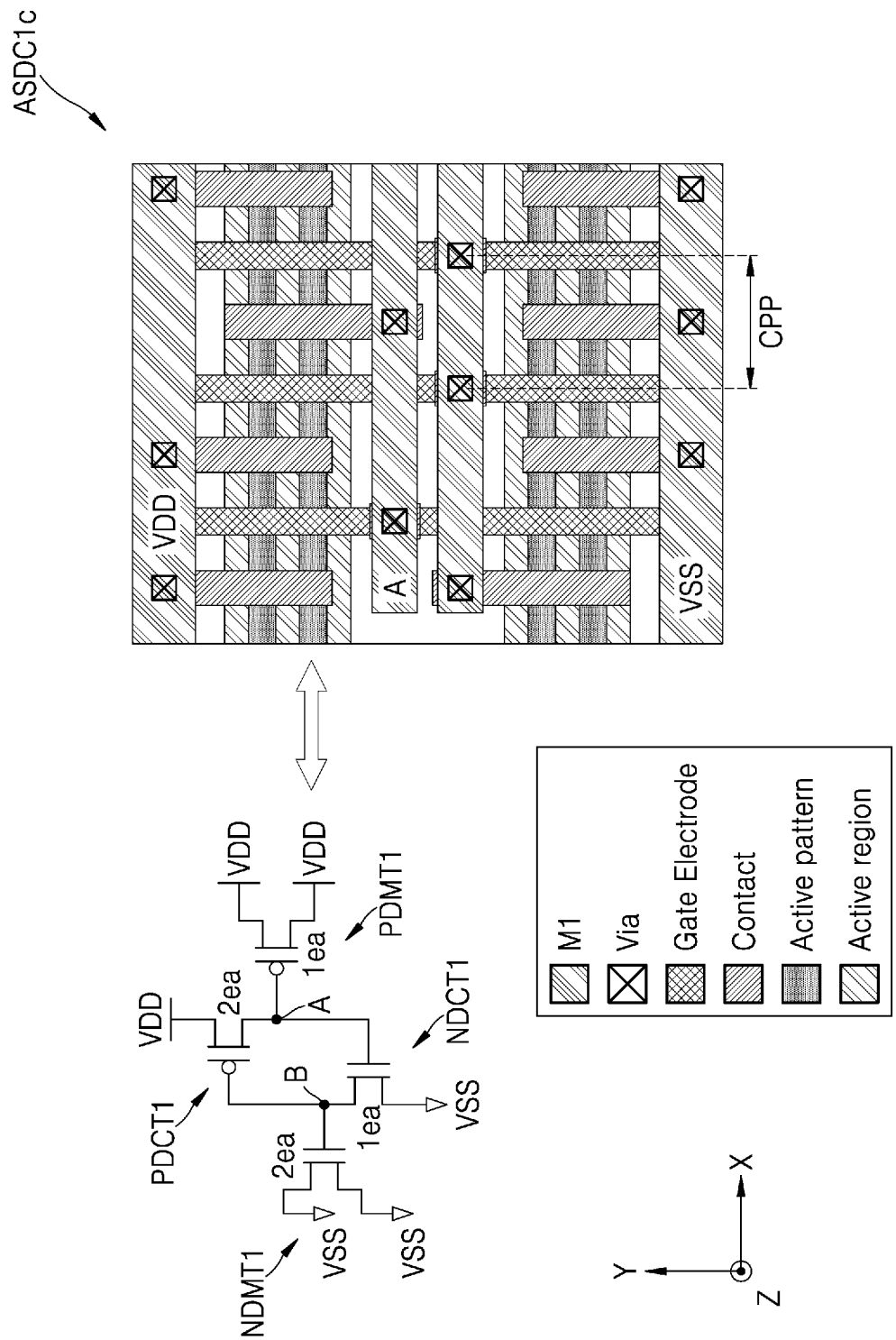

FIG. 4C is a diagram for describing an example of an asymmetric decoupling cell ASDC1c according to some other embodiments. In detail, the left portion of FIG. 4C shows a circuit diagram corresponding to the asymmetric decoupling cell ASDC1c, and the right portion of FIG. 4C shows a layout corresponding to the asymmetric decoupling cell ASDC1c.

For convenience of explanation, descriptions identical to those already given above with reference to FIGS. 2 to 3E will be omitted, and descriptions below will focus on differences therefrom.

Referring to FIG. 4C, unlike in FIG. 2, the asymmetric decoupling cell ASDC1c may have 4 gate pitches CPP. According to example embodiments, the asymmetric decoupling cell ASDC1c may include 3 N-type MOSFETs and 3 P-type MOSFETs. Unlike the asymmetric decoupling cell ASDC1 of FIG. 2, the asymmetric decoupling cell ASDC1c may include 2 P-type decoupling MOSFETs PDCT1, 1 P-type dummy MOSFET PDMT1, 1 N-type decoupling MOSFET NDCT1, and 2 N-type dummy MOSFETs NDMT1.

According to example embodiments, one of ordinary skill in the art may easily implement an asymmetric decoupling cell that may have 5 to 7 gate pitches CPP and 9 or more gate pitches CPP based on descriptions given with reference to FIGS. 2 to 3F and 4C.

Figure 4D:
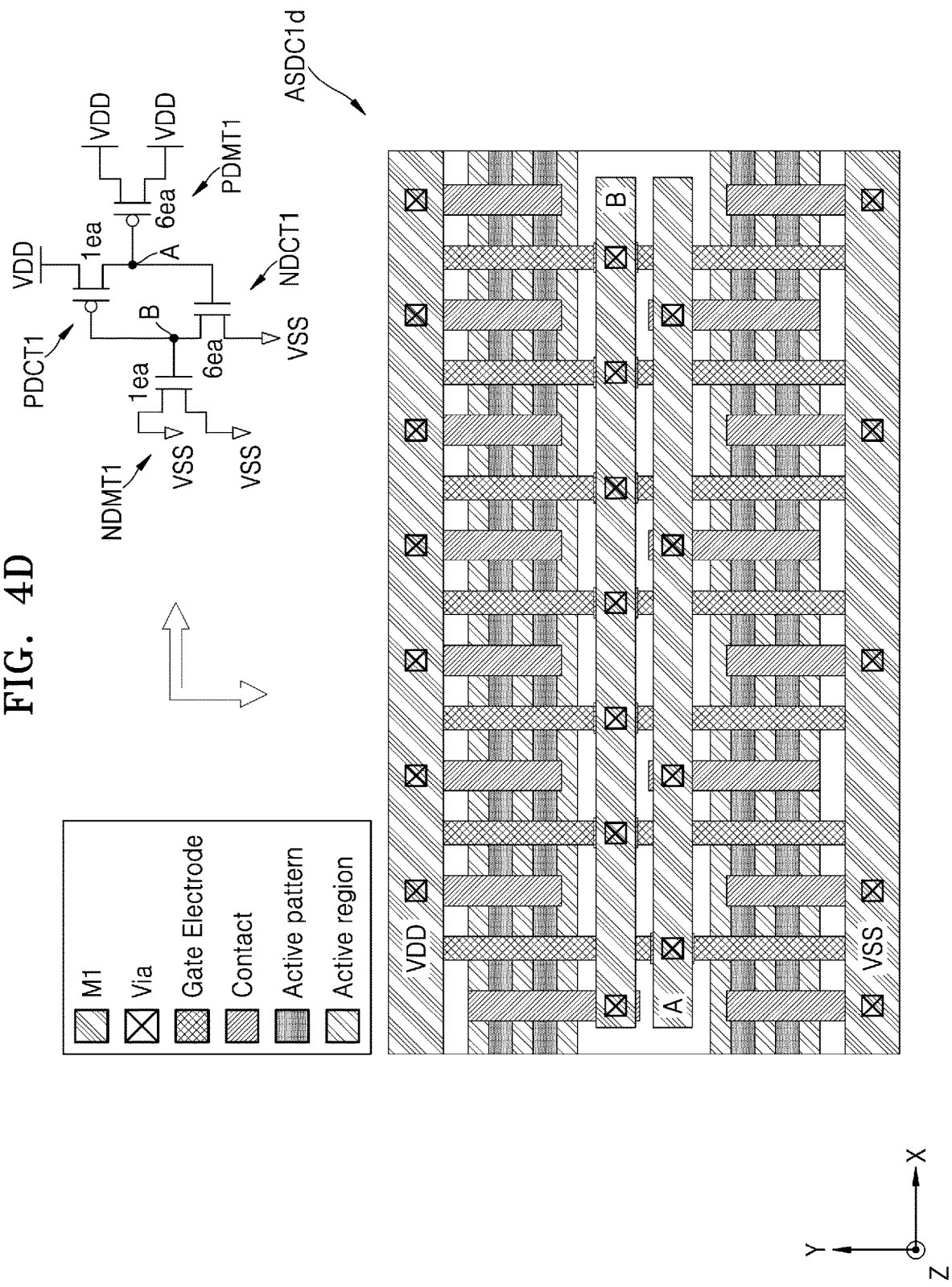

FIG. 4D is a diagram for describing an example of an asymmetric decoupling cell ASDC1d according to some other embodiments. In detail, the upper portion of FIG. 4D shows a circuit diagram corresponding to the asymmetric decoupling cell ASDC1d, and the lower portion of FIG. 4D shows a layout corresponding to the asymmetric decoupling cell ASDC1d.

For convenience of explanation, descriptions identical to those already given above with reference to FIGS. 2 to 3E will be omitted, and descriptions below will focus on differences therefrom.

Referring to FIG. 4D, the asymmetric decoupling cell ASDC1d may have 7 gate pitches CPP. According to example embodiments, the asymmetric decoupling cell ASDC1d may include 7 N-type MOSFETs and 7 P-type MOSFETs. Unlike the asymmetric decoupling cell ASDC1 of FIG. 2, the asymmetric decoupling cell ASDC1d may include 1 P-type decoupling MOSFET PDCT1, 6 P-type dummy MOSFETs PDMT1, 6 N-type decoupling MOSFETs NDCT1, and 1 N-type dummy MOSFET NDMT1.

According to example embodiments, the leakage characteristic of N-type MOSFETs in the asymmetric decoupling cell ASDC1d may be superior to that of P-type MOSFETs. Therefore, the asymmetric decoupling cell ASDC1d may use the N-type MOSFETs as main decoupling capacitors.

Figure 5:
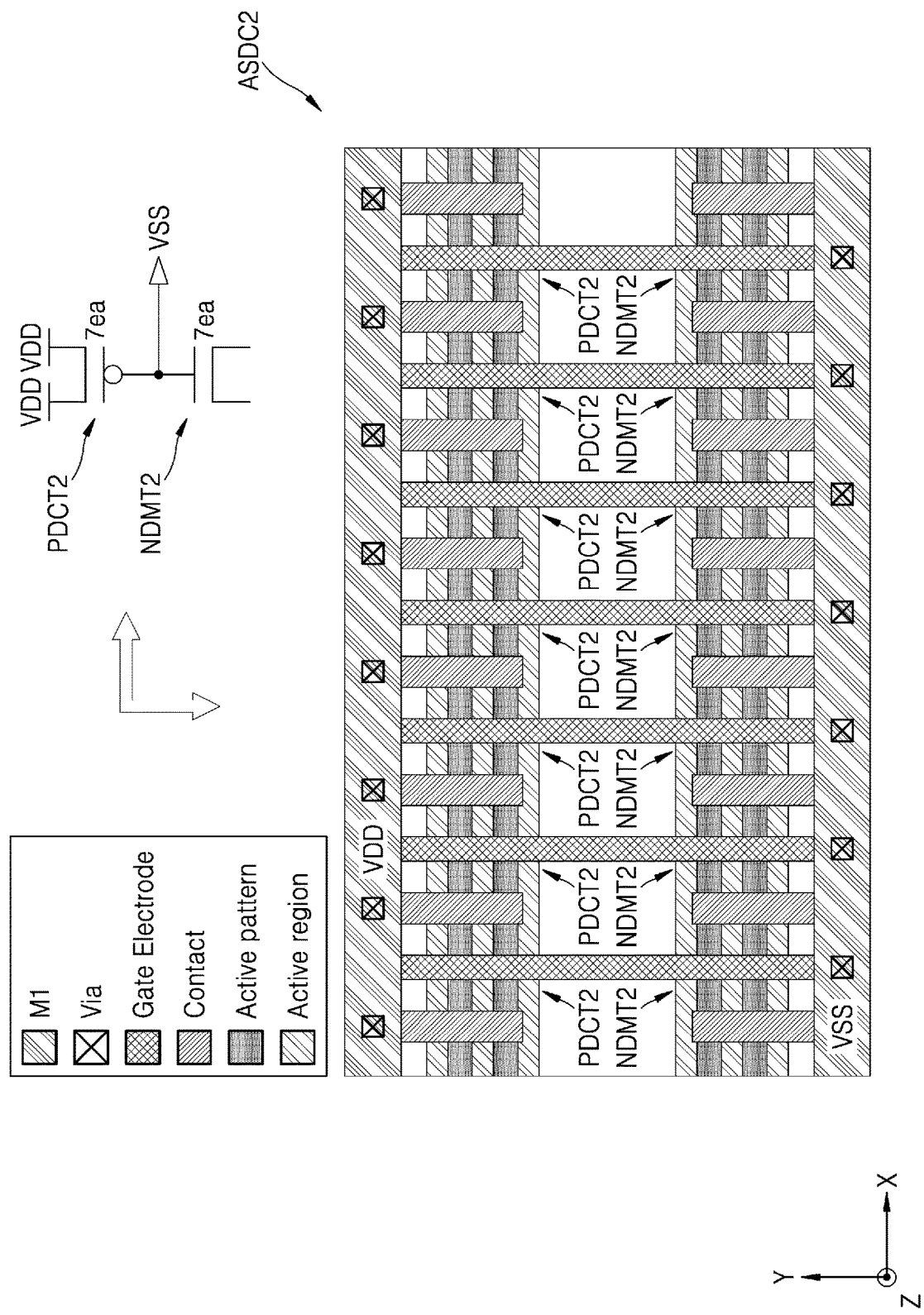
FIG. 5 is a diagram for describing an example of asymmetric decoupling cells according to some other example embodiments.

FIG. 5 is a diagram for describing an example of an asymmetric decoupling cell ASDC2 according to example embodiments. In detail, the upper portion of FIG. 5 shows a circuit diagram corresponding to the asymmetric decoupling cell ASDC2, and the lower portion of FIG. 5 shows a layout corresponding to the asymmetric decoupling cell ASDC2.

For convenience of explanation, descriptions identical to those already given above with reference to FIGS. 2 to 3E will be omitted, and descriptions below will focus on differences therefrom.

Referring to FIG. 5, the asymmetric decoupling cell ASDC2 may include 7 P-type decoupling MOSFETs PDCT2 and 7 N-type dummy MOSFETs NDMT2. According to example embodiments, the positive supply voltage VDD may be applied to sources and drains of the P-type decoupling MOSFETs PDCT2, and the negative supply voltage (or ground potential) VSS may be applied to gates of the P-type decoupling MOSFETs PDCT2. According to example embodiments, sources and drains of the N-type dummy MOSFETs NDMT2 may be floated.

Although FIG. 5 shows that the asymmetric decoupling cell ASDC2 includes 8 gate pitches CPP, embodiments are not limited thereto. For example, the asymmetric decoupling cell ASDC2 may include 2 to 7 gate pitches CPP or 9 or more gate pitches CPP.

According to example embodiments, when the asymmetric decoupling cell ASDC1 of FIG. 2 uses the P-type decoupling MOSFETs PDCT1 as main decoupling capacitors, it is necessary to use at least one N-type MOSFET as a decoupling capacitor to provide the negative supply voltage (or ground potential) VSS to a bias.

On the other hand, because the negative supply voltage (or ground potential) VSS is applied to gate electrodes of the P-type decoupling MOSFETs PDCT2 used as decoupling capacitors, the asymmetric decoupling cell ASDC2 may not use any one of N-type MOSFETs as a decoupling capacitor for a bias. Therefore, all of P-type MOSFETs in the asymmetric decoupling cell ASDC2 may be used as decoupling capacitors, and all of N-type MOSFETs in the asymmetric decoupling cell ASDC2 may be N-type dummy MOSFETs NDMT2. In other words, the asymmetric decoupling cell ASDC2 may include no dummy P-type MOSFET and no N-type decoupling MOSFET.

Figure 6:
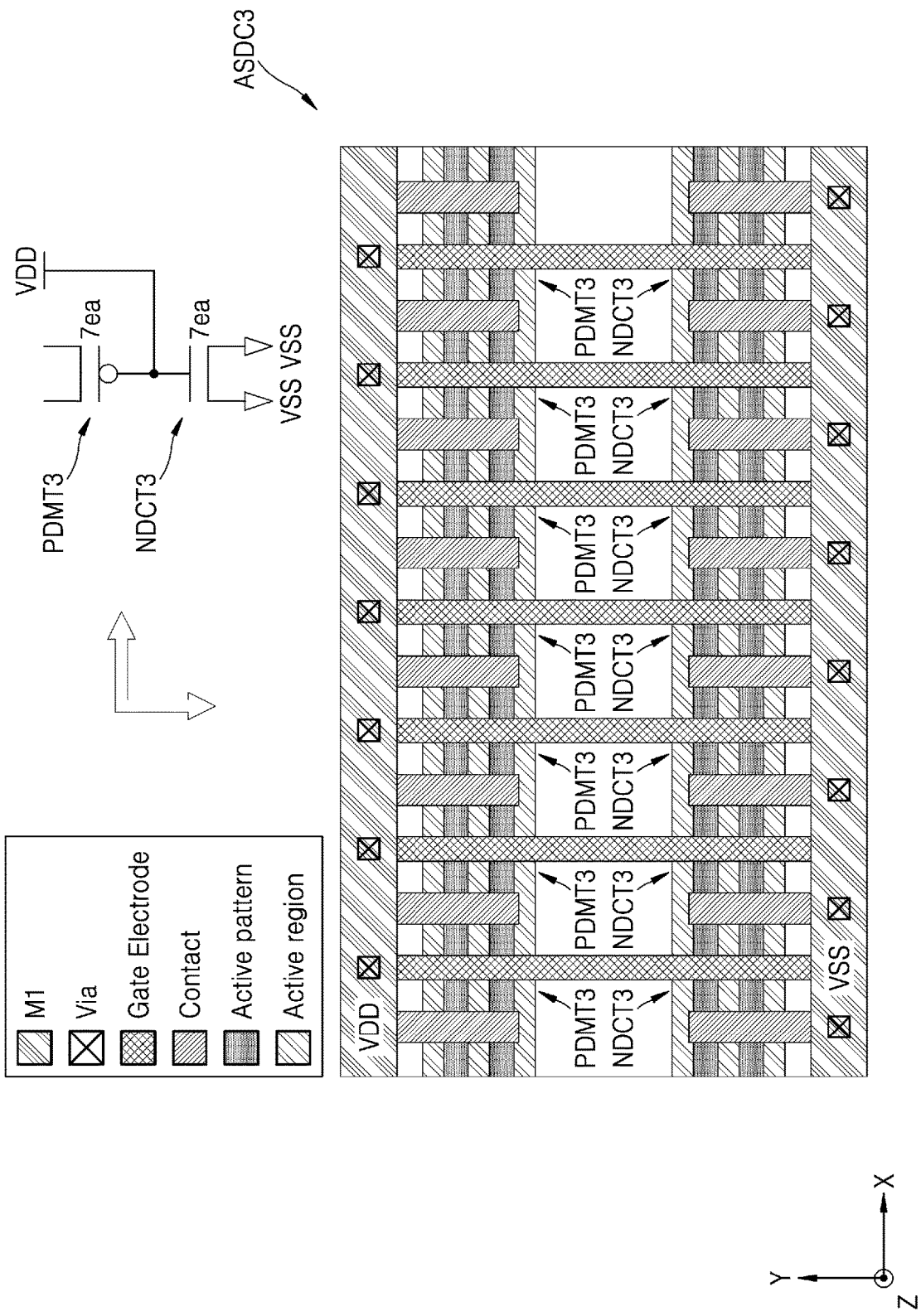
FIG. 6 is a diagram for describing an example of asymmetric decoupling cells according to some other example embodiments.

FIG. 6 is a diagram for describing an example of an asymmetric decoupling cell ASDC3 according to example embodiments. In detail, the upper portion of FIG. 6 shows a circuit diagram corresponding to the asymmetric decoupling cell ASDC3, and the lower portion of FIG. 6 shows a layout corresponding to the asymmetric decoupling cell ASDC3.

For convenience of explanation, descriptions identical to those already given above with reference to FIG. 5 will be omitted, and descriptions below will focus on differences therefrom.

Referring to FIG. 6, the asymmetric decoupling cell ASDC3 may include 7 P-type dummy MOSFETs PDMT and 7 N-type decoupling MOSFETs NDCT. Unlike the asymmetric decoupling cell ASDC2 of FIG. 5, the asymmetric decoupling cell ASDC3 may use N-type MOSFETs as main decoupling capacitors. Therefore, according to example embodiments, the negative supply voltage (or ground potential) VSS may be applied to sources and drains of N-type MOSFETs, and the positive supply voltage VDD may be applied to gates of the N-type MOSFETs. According to example embodiments, sources and drains of P-type MOSFETs may be floated. According to example embodiments, the asymmetric decoupling cell ASDC3 may include no P-type decoupling MOSFET and no N-type dummy MOSFET.

Figure 7:
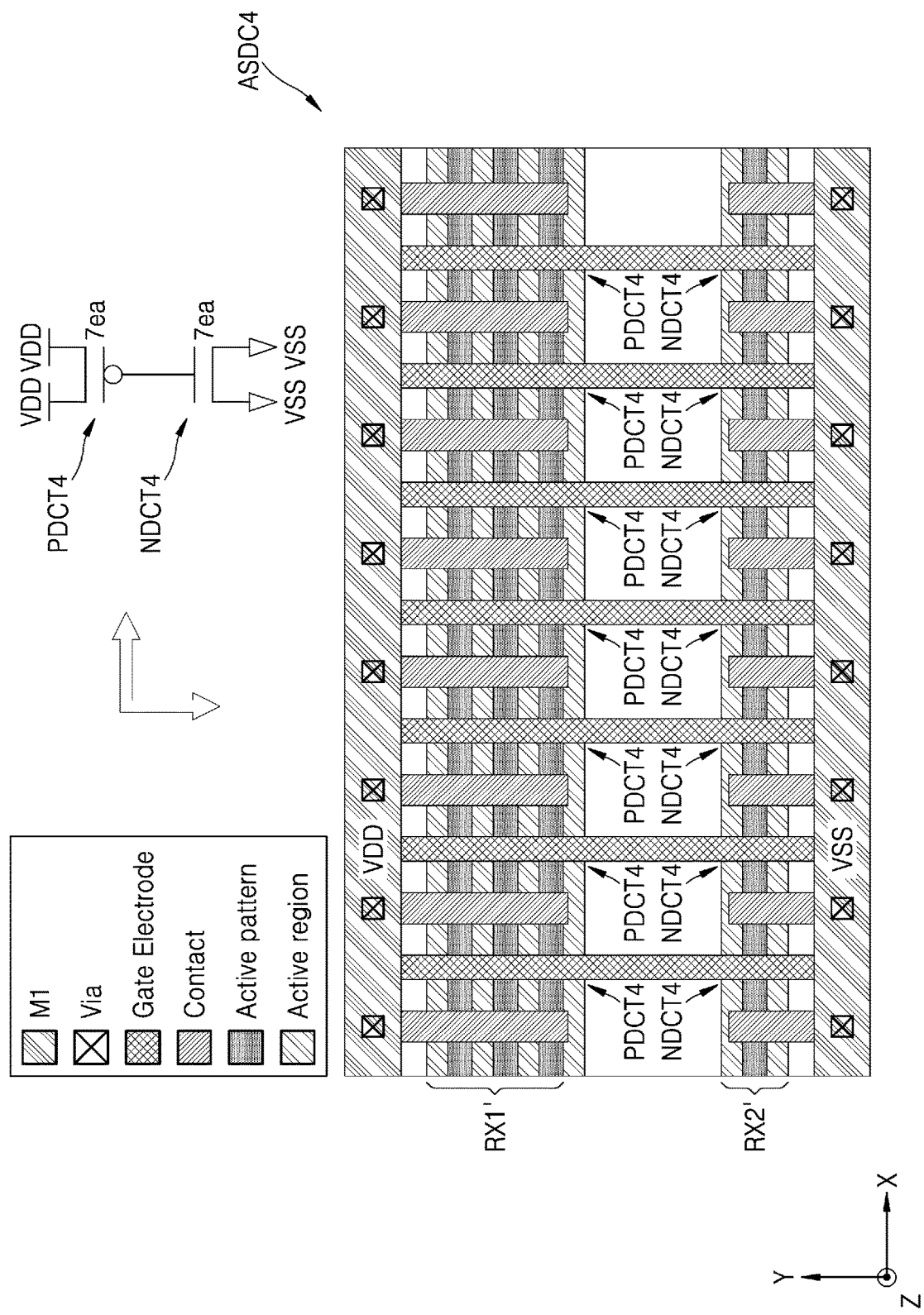
FIG. 7 is a diagram for describing an example of asymmetric decoupling cells according to some other example embodiments.

FIG. 7 is a diagram for describing an example of an asymmetric decoupling cell ASDC4 according to example embodiments. In detail, the upper portion of FIG. 7 shows a circuit diagram corresponding to the asymmetric decoupling cell ASDC4, and the lower portion of FIG. 7 shows a layout corresponding to the asymmetric decoupling cell ASDC4.

For convenience of explanation, descriptions identical to those already given above with reference to FIG. 6 will be omitted, and descriptions below will focus on differences therefrom.

Referring to FIG. 7, the asymmetric decoupling cell ASDC4 may include 7 P-type MOSFETs and 7 N-type MOSFETs. According to example embodiments, the P-type MOSFETs may be P-type decoupling MOSFETs DCPT4, and the N-type MOSFETs may be N-type decoupling MOSFETs NDCT4. According to example embodiments, the P-type decoupling MOSFETs DCPT4 and the N-type decoupling MOSFETs NDCT4 aligned in the Y direction may share gate electrodes. The positive supply voltage VDD may be applied to sources and drains of the P-type decoupling MOSFETs DCPT4. The negative supply voltage (or ground potential) VSS may be applied to sources and drains of the N-type decoupling MOSFETs NDCT4.

According to example embodiments, a height (i.e., a length in the Y direction) of a first active region RX1' may be greater than a height (i.e., a length in the Y direction) of a second active region RX2'. In the embodiment shown in FIG. 7, the height of the first active region RX1' may be twice or greater than (e.g., 3 times) the height of the second active region RX2'. According to example embodiments, the number of active patterns arranged on the first active region RX1' may be greater than the number of active patterns arranged on the second active region RX2'. For example, the number of active patterns arranged on the first active region RX1' may be 3, and the number of active patterns arranged on the second active region RX2' may be 1. However, embodiments are not limited thereto.

According to example embodiments, by forming the first active region RX1', which is a region for forming P-type MOSFETs with excellent leakage current characteristics, to be larger than the second active region RX2', which is a region for forming N-type MOSFETs, the asymmetric decoupling cell ASDC4 having an improved current leakage characteristic while providing an equivalent level of capacitance may be provided.

Figure 8:
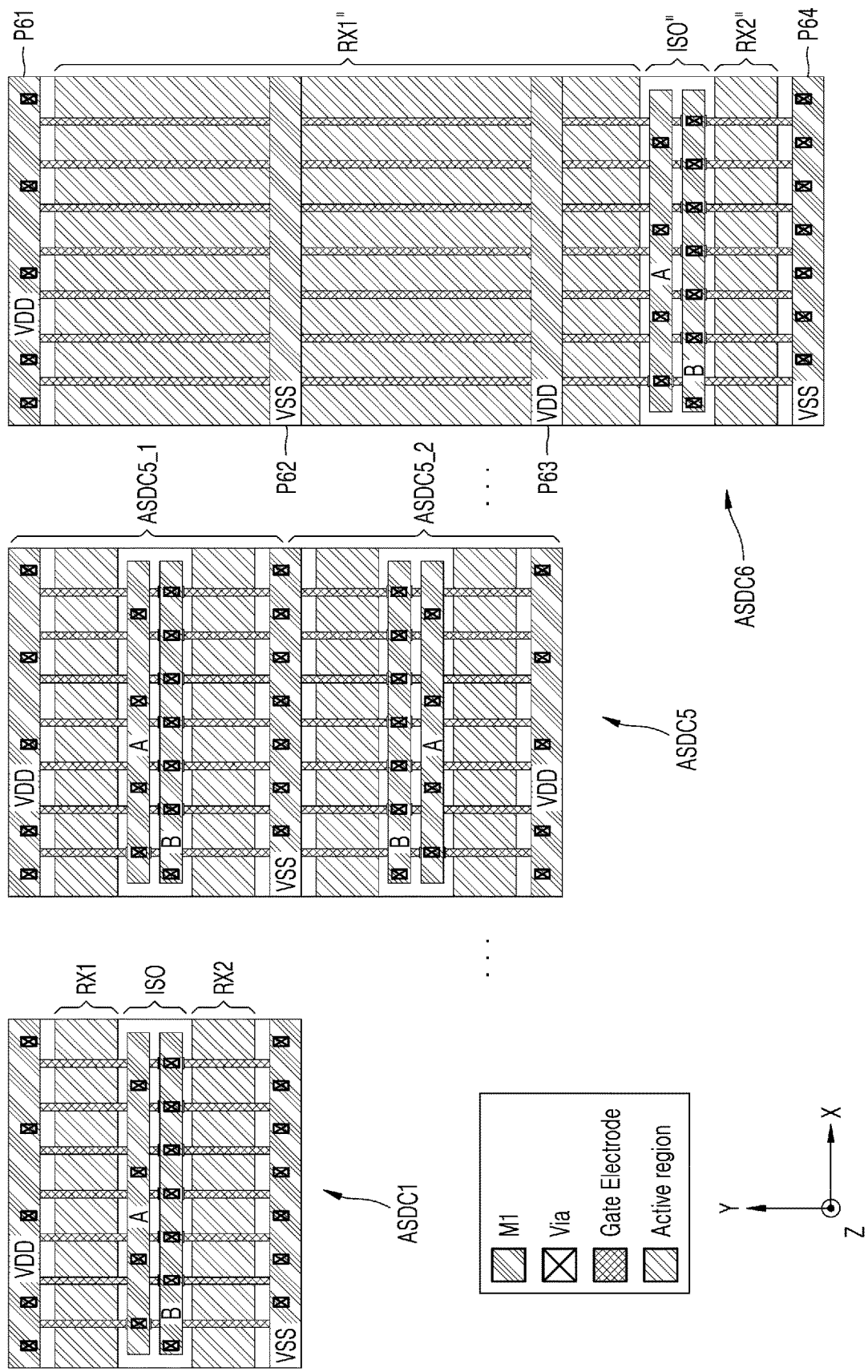
FIG. 8 is a layout diagram showing an integrated circuit according to example embodiments.

FIG. 8 is a diagram for describing an example of a layout of an integrated circuit 11 according to example embodiments.

According to some embodiments, the integrated circuit 11 may include a plurality of asymmetric decoupling cells ASDC1, ASDC5, and ASDC6 having different heights. FIG. 8 only shows the first wiring layer M1, vias, gate electrodes, and active regions.

The asymmetric decoupling cell ASDC1 may be substantially the same as that described above with reference to FIGS. 2 to 3E. According to example embodiments, the height of the asymmetric decoupling cell ASDC5 may be about twice the height of the asymmetric decoupling cell ASDC1. According to example embodiments, the height of the asymmetric decoupling cell ASDC6 may be about 3 times the height of the asymmetric decoupling cell ASDC1.

According to example embodiments, the asymmetric decoupling cell ASDC5 may include a first sub cell ASDC5_1 that is substantially the same as that of the asymmetric decoupling cell ASDC1. The asymmetric decoupling cell ASDC5 may include a second sub cell ASDC5_2 substantially identical to a structure in which asymmetric decoupling is inverted with respect to an axis parallel to the X direction. Therefore, a circuit diagram corresponding to the first sub cell ASDC5_1 and the second sub cell ASDC5_2 is the same as the circuit diagram shown in the upper portion of FIG. 2. The first sub cell ASDC5_1 and the second sub cell ASDC5_2 may share the first wiring layer M1 to provide the negative supply voltage (or ground potential) VSS.

One of ordinary skill in the art may easily achieve an asymmetric decoupling cell having a height about twice the height of the asymmetric decoupling cell ASDC1 and including first and second cells sharing the positive supply voltage VDD, based on the description of the asymmetric decoupling cell ASDC5.

The asymmetric decoupling cell ASDC6 may include a first active region RX1" and a second active region RX2". The second active region RX2" may be provided as a single unit and may have substantially the same height as the second active region RX2 of the asymmetric decoupling cell ASDC1. A device isolation layer ISO" may be between the first active region RX1" and the second active region RX2". The height of the device isolation layer ISO" may be substantially the same as the height of the device isolation layer ISO of the asymmetric decoupling cell ASDC1.

The first active region RX1" may be provided as a single unit, and the height of the first active region RX1" may be greater than the height of the second active region RX2", but embodiments are not limited thereto. For example, a plurality of first active regions RX1" may be provided, and a device isolation layer may be between the first active regions RX1".

The height of the first active region RX1" of the asymmetric decoupling cell ASDC6 may be greater than the height of the first active region RX1 of the asymmetric decoupling cell ASDC1. The height of the first active region RX1" included in the asymmetric decoupling cell ASDC6 may be greater than three times the height of the first active region RX1 of the asymmetric decoupling cell ASDC1 of FIG. 2.

According to example embodiments, from among patterns included in the first wiring layer M1, two patterns P61 and P63 for supplying the positive supply voltage VDD and two patterns P62 and P64 for supplying the negative supply voltage (or ground potential) VSS may be alternately arranged on the asymmetric decoupling cell ASDC6.

According to example embodiments, first to third patterns P61, P62, and P63 may extend in the X direction on the first active region RX1". According to example embodiments, portions of the first to third patterns P61, P62, and P63 may overlap the first active region RX1" in the Z direction.

According to example embodiments, unlike in the asymmetric decoupling cell ASDC1, the device isolation layer ISO" may not be provided between a first pattern P61 and a second pattern P62, between the second pattern P62 and a third pattern P63, and between the third pattern P63 and a fourth pattern P64 in the asymmetric decoupling cell ASDC6. Therefore, because the facing area between an active region and a gate electrode increases, the capacitance relative to the area of the asymmetric decoupling cell ASDC6 may be improved.

Figure 9:
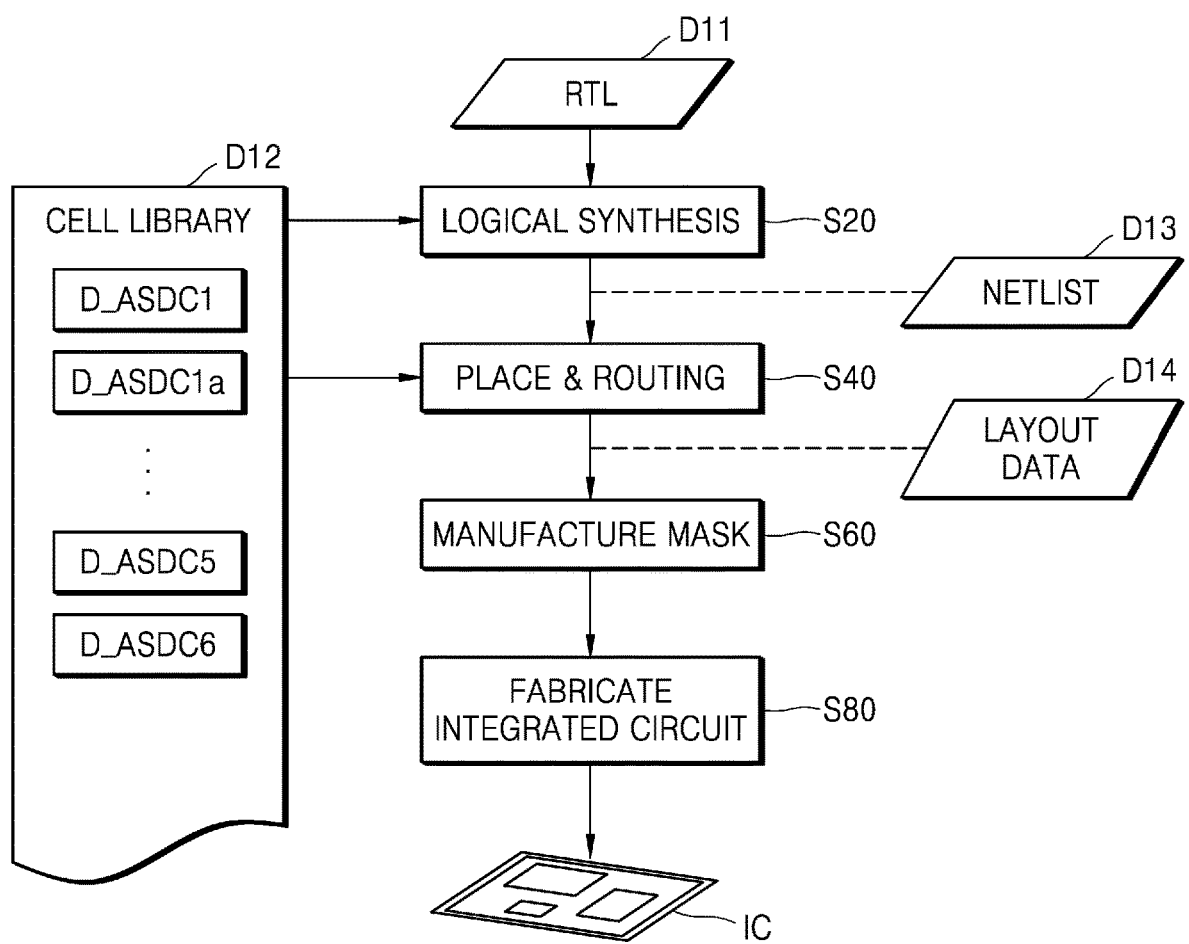
FIG. 9 is a flowchart of a method of fabricating an integrated circuit (IC) according to an example embodiment.

FIG. 9 is a flowchart of a method of fabricating an integrated circuit (IC), according to an example embodiment. In detail, the flowchart of FIG. 9 shows an example of a method of fabricating an IC including a decoupling cell. As shown in FIG. 9, the method of fabricating an IC may include a plurality of operations S20, S40, S60, and S80.

A cell library (or a standard cell library) D12 may include information regarding cells, e.g., function information, characteristic information, layout information, etc. As shown in FIG. 9, the cell library D12 may include first to sixth data D ASDC1 to D ASDC6, which are data for defining asymmetric decoupling cells ASDC1, ASDC1a, ASDC1b, ASDC1c, ASDC1d, ASDC2, ASDC3, ASDC4, ASDC5, and ASDC6 described above with reference to FIGS. 2 to 8.

In operation S20, a logical synthesis operation for generating a netlist D13 from RTL data D11 may be performed. For example, a semiconductor design tool (e.g., a logical synthesis tool) may perform a logical synthesis with reference to the cell library D12 from the RTL data D11 composed in VHSIC Hardware Description Language (VHDL) and Verilog, thereby generating a netlist D13 including a bitstream or a netlist. A semiconductor design tool may select any one of asymmetric decoupling cells ASDC1, ASDC1a, ASDC1b, ASDC1c, ASDC1d, ASDC2, ASDC3, ASDC4, ASDC5, and ASDC6 from the cell library D12, based on conditions of the IC.

In operation S40, a place & routing (P&R) operation for generating layout data D14 from the netlist D13 may be performed. For example, the semiconductor design tool (e.g., a P&R tool) may determine the number of regions in which the asymmetric decoupling cells ASDC1, ASDC1a, ASDC1b, ASDC1c, ASDC1d, ASDC2, ASDC3, ASDC4, ASDC5, and ASDC6 are arranged, the number of rows corresponding to the asymmetric decoupling cells ASDC1, ASDC1a, ASDC1b, ASDC1c, ASDC1d, ASDC2, ASDC3, ASDC4, ASDC5, and ASDC6, for a floor plan of the IC, Next, the semiconductor design tool may refer to the cell library D12 from the netlist D13 and arrange the asymmetric decoupling cells ASDC1, ASDC1a, ASDC1b, ASDC1c, ASDC1d, ASDC2, ASDC3, ASDC4, ASDC5, and ASDC6 in the regions for arranging the asymmetric decoupling cells ASDC1, ASDC1a, ASDC1b, ASDC1c, ASDC1d, ASDC2, ASDC3, ASDC4, ASDC5, and ASDC6. The semiconductor design tool may generate the layout data D14 defining the asymmetric decoupling cells ASDC1, ASDC1a, ASDC1b, ASDC1c, ASDC1d, ASDC2, ASDC3, ASDC4, ASDC5, and ASDC6. The layout data D14 may have a format like GDSII and may include geometric information regarding cells and mutual connections. Operation S40 may alone be or operation S20 and operation S40 may collectively be referred to as a method of designing an IC, and an example of operation S40 will be described below with reference to FIG. 7.

In operation S60, an operation for manufacturing a mask may be performed. For example, optical proximity correction (OPC) for correcting distortion due to characteristics of light (e.g., refraction) in photolithography may be applied to the layout data D14. Patterns on the mask may be defined to form patterns to be arranged in a plurality of layers based on OPC-applied data, and at least one mask (or photomask) for forming patterns of each of the layers may be manufactured. In some embodiments, the layout of the IC may be limitedly modified in operation S60, and the limited modification of the IC in operation S60 is a post-processing for optimizing the structure of the IC and may be referred to as design polishing.

In operation S80, an operation for fabricating the IC may be performed. For example, the IC may be fabricated by patterning the plurality of layers by using the at least one mask manufactured in operation S60. For example, a front-end-of-line (FEOL) may include planarizing and cleaning a wafer, forming a trench, forming a well, forming a gate electrode, and forming a source and a drain, and individual devices like a transistor, a capacitor, and a resistor may be formed on a substrate through the FEOL. Also, for example, a back-end-of-line (BEOL) may include operations like silicidation of a gate, a source region, and a drain region, adding a dielectric, planarizing, forming holes, adding metal layers, forming vias, and forming a passivation layer, and individual devices like a transistor, a capacitor, and a resistor may be connected to one another through the BEOL. In some embodiments, a middle-of line (MOL) may be performed between the FEOL and the BEOL, and contacts may be formed on individual elements. Next, the IC may be packaged in a semiconductor package and used as a component for various applications.

While embodiments have been particularly shown and described with reference to embodiments thereof, it will be understood that various changes in form and details may be made therein without departing from the spirit and scope of the following claims.

What is claimed is:

1. An integrated circuit comprising:
at least one decoupling cell,
wherein the at least one decoupling cell comprises:
a plurality of P-type metal-oxide-semiconductor field effect transistors (MOSFETs) arranged in a first direction; and
a plurality of N-type MOSFETs arranged in the first direction and spaced apart from the plurality of P-type MOSFETs in a second direction that is perpendicular to the first direction,
wherein the plurality of P-type MOSFETs comprise at least one P-type decoupling MOSFET,
wherein the plurality of N-type MOSFETs comprise at least one N-type decoupling MOSFET,
wherein a first number of the at least one P-type decoupling MOSFET is different from a second number of the at least one N-type decoupling MOSFET,
wherein the plurality of P-type MOSFETs comprises at least one P-type dummy MOSFET,
wherein the plurality of N-type MOSFETs comprises at least one N-type dummy MOSFET, and
wherein a third number of the at least one P-type dummy MOSFET is different from a fourth number of the at least one N-type dummy MOSFET.

2. The integrated circuit of claim 1, wherein the first number of the at least one P-type decoupling MOSFET is greater than the second number of the at least one N-type decoupling MOSFET.

3. The integrated circuit of claim 1, wherein a first gate electrode of the at least one P-type decoupling MOSFET is connected to a source region of the at least one N-type decoupling MOSFET, and a second gate electrode of the at least one N-type decoupling MOSFET is connected to a drain region of the at least one P-type decoupling MOSFET.

4. The integrated circuit of claim 1, wherein a first wiring configured to provide a positive supply voltage is connected to a source region of the at least one P-type decoupling MOSFET, and
wherein a second wiring configured to provide a negative supply voltage is connected to a drain region of the at least one N-type decoupling MOSFET.

5. The integrated circuit of claim 1, wherein the first number of the at least one P-type decoupling MOSFET is same as the fourth number of the at least one N-type dummy MOSFET.

6. The integrated circuit of claim 1, wherein a first sum of the first number of the at least one P-type decoupling MOSFET and the third number of the at least one P-type dummy MOSFET is same as a second sum of the second number of the at least one N-type decoupling MOSFET and the fourth number of the at least one N-type dummy MOSFET.

7. The integrated circuit of claim 1, wherein a first wiring configured to provide a positive supply voltage is connected to a first source region and a first drain region of the at least one P-type dummy MOSFET, and a second wiring configured to provide a negative supply voltage is connected to a second source region and a second drain region of the at least one N-type dummy MOSFET.

8. An integrated circuit comprising:
a first decoupling cell having a first height in a first direction,
wherein the first decoupling cell comprises:
a plurality of first P-type metal-oxide-semiconductor field effect transistors (MOSFETs) arranged in a second direction that is perpendicular to the first direction; and
a plurality of first N-type MOSFETs arranged in the second direction and spaced apart from the plurality of first P-type MOSFETs in the first direction,
wherein the plurality of first P-type MOSFETs comprises at least one first P-type decoupling MOSFET and at least one first P-type dummy MOSFET,
wherein the plurality of first N-type MOSFETs comprises at least one first N-type decoupling MOSFET and at least one first N-type dummy MOSFET,
wherein a first number of the at least one first P-type decoupling MOSFET is different from a second number of the at least one first N-type decoupling MOSFET, and
wherein a third number of the at least one first P-type dummy MOSFET is different from a fourth number of the at least one first N-type dummy MOSFET.

9. The integrated circuit of claim 8, further comprising a second decoupling cell having a second height that is different from the first height of the first decoupling cell,
wherein the second decoupling cell comprises a first sub cell substantially identical to the first decoupling cell and a second sub cell substantially identical to the first decoupling cell inverted around an axis parallel to the second direction.

10. The integrated circuit of claim 9, wherein the first sub cell and the second sub cell are configured to share a first wiring configured to provide a positive supply voltage.

11. The integrated circuit of claim 9, wherein the first sub cell and the second sub cell are configured to share a first wiring configured to provide a negative supply voltage.

12. The integrated circuit of claim 9, further comprising a third decoupling cell having a third height that is different from the first height and the second height,
wherein the third decoupling cell comprises a first active region in which a plurality of third P-type MOSFETs are formed and a second active region in which a plurality of third N-type MOSFETs are formed, and
a fourth height of the first active region in the first direction is greater than a fifth height of the second active region in the first direction.

13. The integrated circuit of claim 12, wherein the fourth height of the first active region in the first direction is at least twice the fifth height of the second active region in the first direction.

14. The integrated circuit of claim 12, wherein the third decoupling cell comprises only one first active region.

15. An integrated circuit comprising:
at least one decoupling cell,
wherein the at least one decoupling cell comprises:
a first conductivity type decoupling metal-oxide-semiconductor field effect transistor (MOSFET); and
a second conductivity type decoupling MOSFET, and
wherein a first capacitance associated with the first conductivity type decoupling MOSFET is greater than a second capacitance associated with the second conductivity type decoupling MOSFET,
wherein the integrated circuit further comprises:
a third number of N-type dummy MOSFETs, and
a fourth number of P-type dummy MOSFETs,
wherein the third number is different from the fourth number, and
wherein the fourth number of P-type dummy MOSFETs comprises a first P-type dummy MOSFET, and a source and a drain of the first P-type dummy MOSFET are both connected to a supply voltage wiring layer of the integrated circuit.

16. The integrated circuit of claim 15, wherein the at least one decoupling cell further comprises:
a plurality of first conductivity type decoupling MOSFETs including the first conductivity type decoupling MOSFET;
a plurality of second conductivity type decoupling MOSFETs including the second conductivity type decoupling MOSFET, and
wherein a first number of the plurality of first conductivity type decoupling MOSFETs is greater than a number of the plurality of second conductivity type decoupling MOSFETs.

17. The integrated circuit of claim 15, wherein a first leakage current of the first conductivity type decoupling MOSFET is less than a second leakage current of the second conductivity type decoupling MOSFET.

18. The integrated circuit of claim 15, the at least one decoupling cell further comprises:
a first conductivity type dummy MOSFET; and
a second conductivity type dummy MOSFET,
wherein the first conductivity type decoupling MOSFET and the second conductivity type dummy MOSFET share a first gate electrode extending in a second direction that is perpendicular to a first direction, and
the second conductivity type decoupling MOSFET and the first conductivity type dummy MOSFET share a second gate electrode extending in the second direction.

19. The integrated circuit of claim 15, wherein the at least one decoupling cell further comprises:
a first active region extending in a first direction; and a second active region spaced extending in the first direction and spaced apart from the first active region in a second direction that is perpendicular to the first direction, wherein the first conductivity type decoupling MOSFET is formed on the first active region, wherein the second conductivity type decoupling MOSFET is formed on the second active region, and wherein a first length of the first active region in the second direction is greater than a second length of the second active region in the second direction.

\* \* \* \* \*